(12) United States Patent
Sonobe et al.

(10) Patent No.: US 11,871,678 B2
(45) Date of Patent: Jan. 9, 2024

(54) MAGNETIC MEMORY DEVICE AND OPERATION METHOD THEREOF

(71) Applicant: Samsung Electronics Co., Ltd., Suwon-si (KR)

(72) Inventors: Yoshiaki Sonobe, Yokohama (JP); Syuta Honda, Osaka (JP); Yasuaki Nakamura, Ehime (JP); Yoshihiro Okamoto, Ehime (JP)

(73) Assignees: Samsung Electronics Co., Ltd., Gyeonggi-do (KR); Kansai University, Osaka (JP); National University Corporation Ehime University, Ehime (JP)

( * ) Notice: Subject to any disclaimer, the term of this patent is extended or adjusted under 35 U.S.C. 154(b) by 161 days.

(21) Appl. No.: 17/580,971

(22) Filed: Jan. 21, 2022

(65) Prior Publication Data
US 2022/0238796 A1    Jul. 28, 2022

(30) Foreign Application Priority Data

Jan. 22, 2021    (JP) ................. 2021-008391

(51) Int. Cl.
*G11C 11/16*    (2006.01)
*H10N 50/10*    (2023.01)
(Continued)

(52) U.S. Cl.
CPC ........... *H10N 50/10* (2023.02); *G11C 11/161* (2013.01); *G11C 11/1673* (2013.01);
(Continued)

(58) Field of Classification Search
CPC ........ H01N 50/10; H01N 50/85; H10B 61/00; H10N 50/80; G11C 11/161
See application file for complete search history.

(56) References Cited

U.S. PATENT DOCUMENTS 7,924,593 B2    4/2011  Lee et al.
9,184,376 B2    11/2015 Park et al.
(Continued)

FOREIGN PATENT DOCUMENTS

JP    2010-010683 A    1/2010
JP    2013-201220 A    10/2013
(Continued)

OTHER PUBLICATIONS

Aleksandr Kurenkov et al., "Neuromorphic computing with antiferromagnetic spintronics", J. Appl. Phys. 128, 010902 (2020).

*Primary Examiner* — Min Huang
(74) *Attorney, Agent, or Firm* — Harness, Dickey & Pierce, P.L.C.

(57) ABSTRACT

A magnetic memory device includes a first magnetic memory device, a second magnetic memory device, a pulse power supplying current pulses to the first and second magnetic memory devices; and a switch configured to selectively connect the pulse power to one of the first and second magnetic memory devices. A resistance value of an MTJ device composed of the first fixed layer, the first non-magnetic layer, and the free layer is different from a resistance value of a MTJ device composed of the second fixed layer, the second non-magnetic layer, and the free layer.

19 Claims, 21 Drawing Sheets

(51) Int. Cl.
  *H10B 61/00*    (2023.01)
  *H10N 50/80*    (2023.01)
  *H10N 50/85*    (2023.01)

(52) U.S. Cl.
  CPC ...... *G11C 11/1675* (2013.01); *G11C 11/1697* (2013.01); *H10B 61/00* (2023.02); *H10N 50/80* (2023.02); *H10N 50/85* (2023.02)

(56) References Cited

U.S. PATENT DOCUMENTS

| | | |
|---|---|---|
| 9,343,129 B2 | 5/2016 | Shimomura |
| 9,577,181 B2 | 2/2017 | Tang et al. |
| 2013/0250666 A1* | 9/2013 | Shimomura ............ G11C 11/16 365/158 |
| 2018/0144240 A1* | 5/2018 | Garbin ................... G06N 3/045 |
| 2022/0115049 A1* | 4/2022 | Sonobe ............... G11C 11/1675 |
| 2022/0254396 A1* | 8/2022 | Dutta ..................... H10N 50/80 |

FOREIGN PATENT DOCUMENTS

| | | |
|---|---|---|
| JP | 2015-115610 A | 6/2015 |
| JP | 2020-043364 A | 3/2020 |
| WO | WO-2007/135723 A1 | 11/2007 |
| WO | WO-2016/159017 A1 | 10/2016 |
| WO | WO-2017/183573 A1 | 10/2017 |

\* cited by examiner

MAGNETIC MEMORY DEVICE AND OPERATION METHOD THEREOF

CROSS-REFERENCE TO RELATED APPLICATIONS

This U.S. non-provisional patent application claims priority under 35 U.S.C. § 119 to Japanese Patent Application No. 2021-008391, filed on Jan. 22, 2021 in the Japan Patent Office, the entire contents of which are hereby incorporated by reference.

BACKGROUND OF THE INVENTION

The present disclosure relates to a magnetic memory device and an operation method thereof.

A magnetoresistance device, which has a perpendicular magnetization and executes a reading operation using a magnetoresistance effect, has a good thermal disturbance property against a reduction of pattern size and is one of convincing candidates that are being considered as a next-generation memory device. The magnetoresistance device includes a magnetic tunnel junction (MTJ) layer having a free layer having a variable magnetization direction, a fixed layer having a fixed magnetization direction, and an insulating layer interposed between the free and fixed layers. A spin transfer torque magnetoresistive random access memory (STT-MRAM), which is realized based on the MTJ device, is being put to practical use. The STT-MRAM has a two terminal structure and has no difference in a write current path and a read current path.

Patent document 1 discloses an analog memory device realized using a magnetic memory having a three-terminal structure. In the analog memory device of the patent document 1, multiple resistance values may be output by changing a position of a domain wall in a magnetic driving layer.

PRIOR ART DOCUMENT

Patent Document

[Patent Document 1] WO/2017/183573

SUMMARY

In the conventional STT-MRAM or spin-orbit torque (SOT)-MRAM, a write torque exerts an influence on only a magnetization of a surface of a free layer, and thus, for a thick layer or a cylindrical structure, it is hard to control a magnetization direction of a ferromagnetic metal, which is long in a direction normal to a substrate. That is, a thick layer or a cylinder structure may be hardly used as a structure for a free layer. However, it is necessary to develop an MRAM device, which has a two-terminal structure and includes a free layer that is realized using a ferromagnetic metal elongated in the direction normal to the substrate, because it allows for high thermal stability of the free layer, bit representation of analog signal, multibit representation, and structural simplification and high density of a device.

According to an embodiment of the inventive concept, a magnetic memory device may include a first magnetic memory device, a second magnetic memory device connected to the first magnetic memory device, a pulse power supplying current pulses to the first and second magnetic memory devices, and a switch configured to selectively connect the pulse power to one of the first and second magnetic memory devices. Each of the first and second magnetic memory devices may include a first fixed layer, a first non-magnetic layer, a free layer, a second non-magnetic layer, and a second fixed layer, which are sequentially stacked. The first fixed layer may have a magnetization direction maintained in a fixed direction, the free layer may have a perpendicular magnetic anisotropy and a variable magnetization direction, and the second fixed layer may have a magnetization direction maintained in an opposite direction of the first fixed layer. A resistance value of an MTJ device composed of the first fixed layer, the first non-magnetic layer, and the free layer may be different from a resistance value of an MTJ device composed of the second fixed layer, the second non-magnetic layer, and the free layer. Due to this structure, it may be possible to read a multi-valued data, even when the structure of the device is simple.

In an embodiment, the magnetic memory device may further include a pulse counter which is used to count the number of the current pulses supplied from the pulse power. Thus, the multi-valued data may be read out, based on the value counted by the pulse counter.

In an embodiment, the second fixed layer of the first magnetic memory device may be connected to the second fixed layer of the second magnetic memory device, one of two outputs of the pulse power may be connected to the first fixed layer of the first magnetic memory device, and the switch may be configured to change connection of the pulse power such that the other of the two outputs of the pulse power is connected to the second fixed layer of the first magnetic memory device or the first fixed layer of the second magnetic memory device. Thus, it may be possible to simplify a connection structure.

In an embodiment, when a data reading operation on the magnetic memory device is performed, the other of the two outputs of the pulse power may be switched to be connected to the first fixed layer of the second magnetic memory device by the switch. The data reading operation may include a first reading operation and a second reading operation which are alternately performed, and the pulse power may produce current pulses flowing in opposite directions, in the first and second reading operations. Thus, it may be possible to repeatedly read the data.

In an embodiment, the other of the two outputs of the pulse power may be switched to be connected to the first fixed layer of the second magnetic memory device by the switch, when a data erase operation on the magnetic memory device is performed. The other of the two outputs of the pulse power may be switched to be connected to the second fixed layer of the first magnetic memory device by the switch, when a data write operation on the magnetic memory device is performed. Accordingly, even when a structure of the device is simple, it may be possible to write a multi-valued data.

In an embodiment, each of the first and second magnetic memory devices may include two or more memory devices connected in series. Accordingly, it may be possible to increase a write capacity of the device.

In an embodiment, the magnetic memory device may be used to write a coupling weight value of a neural network. Thus, a calculation on the neural network may be executed in a simple and fast manner.

In an embodiment, the magnetic memory device may be used to write a weight of a reservoir calculation model. Accordingly, a calculation on the reservoir calculation model may be executed in a simple and fast manner.

According to an embodiment of the inventive concept, a method of operating a magnetic memory device may be provided. The magnetic memory device may include a first magnetic memory device and a second magnetic memory device connected to the first magnetic memory device. Each of the first and second magnetic memory devices may include a first fixed layer, a first non-magnetic layer, a free layer, a second non-magnetic layer, and a second fixed layer, which are sequentially stacked. The first fixed layer may have a magnetization direction maintained in a fixed direction, the free layer may have a perpendicular magnetic anisotropy and a variable magnetization direction, and the second fixed layer may have a magnetization direction maintained in an opposite direction of the first fixed layer. A resistance value of an MTJ device composed of the first fixed layer, the first non-magnetic layer, and the free layer may be different from a resistance value of an MTJ device composed of the second fixed layer, the second non-magnetic layer, and the free layer. The method of operating the magnetic memory device may include a first reading step supplying driving pulses to the first and second magnetic memory devices until the entirety of the free layer of the first magnetic memory device has the same magnetization direction, thereby transferring a data value, which is written in the free layer of the first magnetic memory device, to the free layer of the second magnetic memory device, and a second reading step supplying driving pulses to the first and second magnetic memory devices until the entirety of the free layer of the second magnetic memory device has the same magnetization direction, thereby transferring a data value, which is written in the free layer of the second magnetic memory device, to the free layer of the first magnetic memory device. Thus, even when a structure of the device is simple, it may be possible to read a multi-valued data.

In an embodiment, the operating method may further include an erase step supplying driving pulses to the first and second magnetic memory devices such that the entirety of the free layer of the first magnetic memory device has the same magnetization direction and the entirety of the free layer of the second magnetic memory device has the same magnetization direction, and a write step supplying current pulses whose number is given based on a data value to be written to the first magnetic memory device to change the magnetization direction of the free layer of the first magnetic memory device, before the first reading step and the second reading step. Thus, even when a structure of the device is simple, it may be possible to write a multi-valued data.

In an embodiment, the first reading step and the second reading step may be performed in an alternate manner. Accordingly, it may be possible to repeatedly read out a written data value.

DETAILED DESCRIPTION

[Basic Structure of Magnetic Memory Device]

Figure 1:
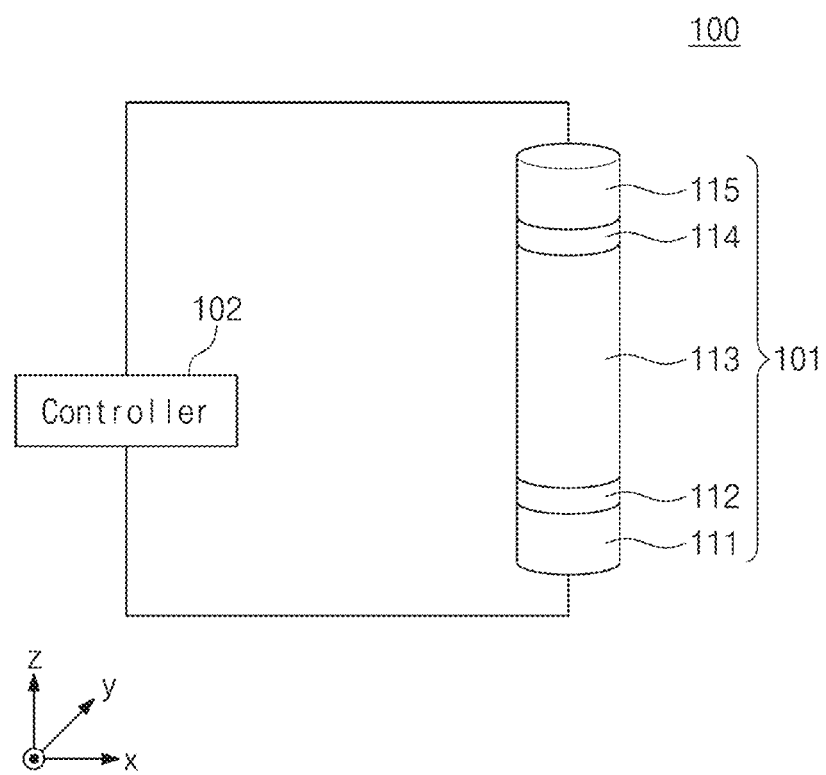
FIG. 1 illustrates a magnetic memory device.

Hereinafter, embodiments of the inventive concept will be described with reference to the accompanying drawings. FIG. 1 illustrates a magnetic memory device according to the present embodiment. In FIG. 1, a structure of a magnetic memory device is illustrated as a perspective view, and a circuit connected to a magnetic memory device is illustrated as a schematic diagram.

Referring to FIG. 1, a magnetic memory device 100 may include a magnetic memory device 101 and a controller 102. The magnetic memory device 101 may include a first fixed layer 111; a first non-magnetic layer 112; a free layer 113; a second non-magnetic layer 114; and a second fixed layer 115. As shown in FIG. 1, the first fixed layer 111, the first non-magnetic layer 112, the free layer 113, the second non-magnetic layer 114, and the second fixed layer 115 may be sequentially stacked.

Each of the first and second fixed layers 111 and 115 may be a layer whose magnetization direction is fixed to a specific direction. A material for the first and second fixed layers 111 and 115 may be chosen to have a magnetization direction that is not easily changed. For example, a material having large effective magnetic anisotropy (Kueff), large saturation magnetization (Ms), and large magnetic relaxation constant $\alpha$ may be chosen as a material for the first and second fixed layers 111 and 115. However, the inventive concept is not limited to a specific material for the first and second fixed layers 111 and 115 and various materials may be chosen as the first and second fixed layers 111 and 115, based on various conditions.

For example, the first and second fixed layers 111 and 115 may be composed of or include a layer, in which CoFeB is a principal component thereof, and a Co/Pt multi-layer. In addition, the first and second fixed layers 111 and 115 may be composed of or include a layer, in which Heusler alloy is a principal component thereof, and a Co/Pt multi-layer. Here, the layer containing the Heusler alloy as its principal component may be a layer containing a Co-based full-Heusler alloy as its principal component. In detail, the Co-based full-Heusler alloy may include $Co_2FeSi$, $Co_2MnSi$, $Co_2FeMnSi$, $Co_2FeAl$, or $Co_2CrAl$. The Co/Pt multi-layer may be provided to realize high perpendicular magnetic anisotropy. Here, the term "perpendicular" may be used to represent a direction that is normal to a stacking surface and is oriented from the first fixed layer 111 toward the second fixed layer 115. The first fixed layer 111 may be connected to the first non-magnetic layer 112. The second fixed layer 115 may be in contact with the second non-magnetic layer 114. In addition, the layer containing the Heusler alloy as its principal component may be in contact with the Co/Pt multi-layer placed at an opposite side. Since each of the first and second fixed layers 111 and 115 is configured to have the afore-described structure, each of the first and second fixed layers 111 and 115 may serve as a layer maintaining a magnetization direction of a single layer to a specific direction. In addition, the first and second fixed layers 111 and 115 may be formed of or include at least one of $L1_0$-type FePd, FePt, MnGa alloy, $D0_{22}$-type MnGa, MnGe alloy, Co/Pd multi-layer, $L1_1$-type CoPd alloy, or CoPt alloy and may be formed of a ferromagnetic material whose magnetization easy axis is oriented in a direction perpendicular to a layer surface.

In addition, the first and second fixed layers 111 and 115 may be called a reference layer. The first and second fixed layers 111 and 115 may have magnetization directions that are opposite to each other.

Each of the first and second non-magnetic layers 112 and 114 may contain an insulating material as a principal component thereof. The first non-magnetic layer 112 may be provided between the first fixed layer 111 and the free layer 113, which have the ferromagnetic property, a. Also, the second non-magnetic layer 114 may be provided between the second fixed layer 115 and the free layer 113, which have the ferromagnetic property. For example, the first and second non-magnetic layers 112 and 114 may be formed of or include at least one of insulating materials (e.g., MgO).

In addition, a material for the first and second non-magnetic layers 112 and 114 may be an oxide material having a NaCl structure. For example, CaO, SrO, TiO, VO, or NbO, in addition to the afore-described MgO, may be used as the material for the first and second non-magnetic layers 112 and 114, but the inventive concept is not limited to a specific material as long as there is no deterioration in function of the first and second non-magnetic layers 112 and 114. For example, spinel-type $MgAl_2O_4$ or the like may be used as a material for the first and second non-magnetic layers 112 and 114. In an embodiment, the first and second non-magnetic layers 112 and 114 may be formed of or include at least one of metallic materials (e.g., Cu, Cr, and Ru).

In the case where a voltage is applied to the first fixed layer 111 and the free layer 113 in a direction normal to a junction surface therebetween, a current flow may be produced to pass through a MTJ device including the first fixed layer 111, the first non-magnetic layer 112, and the free layer 113, due to a tunnel effect. Similarly, in the case where a voltage is applied to the second fixed layer 115 and the free layer 113 in a direction normal to a junction surface therebetween, a current flow may be produced to pass through a MTJ device including the free layer 113, the second non-magnetic layer 114, and the second fixed layer 115, due to a tunneling effect.

The free layer 113 may be a layer, which has a magnetization easy axis that is perpendicular to a plane of the layer, and has a magnetization direction that can be changed by a magnetization rotation and a domain wall movement. For example, the free layer 113 may have a magnetization, which is perpendicular to the plane of the layer, and may have a domain wall, which is oriented in an upward or downward direction. The free layer 113 is not limited to a specific material and may be chosen from various materials, depending on technical requirements. For example, CoFeB may be used as a principal component of the free layer 113. In addition, the free layer 113 may be formed of a Co-based full-Heusler alloy. For example, the Co-based full-Heusler alloy may be $Co_2FeSi$, $Co_2MnSi$, $Co_2(Fe-Mn)Si$, $Co_2FeAl$, or $Co_2CrAl$. In addition, at least one of MnGaGe-based materials of low Ms or FeNi-based materials having relatively small intrinsic crystalline magnetic anisotropy (Ku) may be used as a material for the free layer 113.

To control the magnetization of the free layer 113, the controller 102 may produce a voltage causing a spin current in the free layer 113. In addition, the controller 102 may produce a voltage causing a movement of domain wall between the first and second fixed layers 111 and 115 of the magnetic memory device 101. In addition, to read a magnetization direction of the free layer 113 (i.e., a written data), the controller 102 may measure a current, voltage, or electric resistance between the first and second fixed layers 111 and 115 of the magnetic memory device 101.

Due to the afore-described configuration, the magnetic memory device 100 may perform data writing and reading operations. Now, an operation of writing data in the magnetic memory device 101 using the controller 102 and an operation of moving a domain wall in the free layer 113 using the controller 102 will be described below. Several operations on a magnetic memory device according to an embodiment of the inventive concept will be described in more detail with reference to FIGS. 2 to 9.

First of all, an example method of writing an upward magnetization in the free layer 113 will be described with reference to FIGS. 2 to 5. Here, the term "upward" may mean a direction of a positive Z axis.

Figure 2:
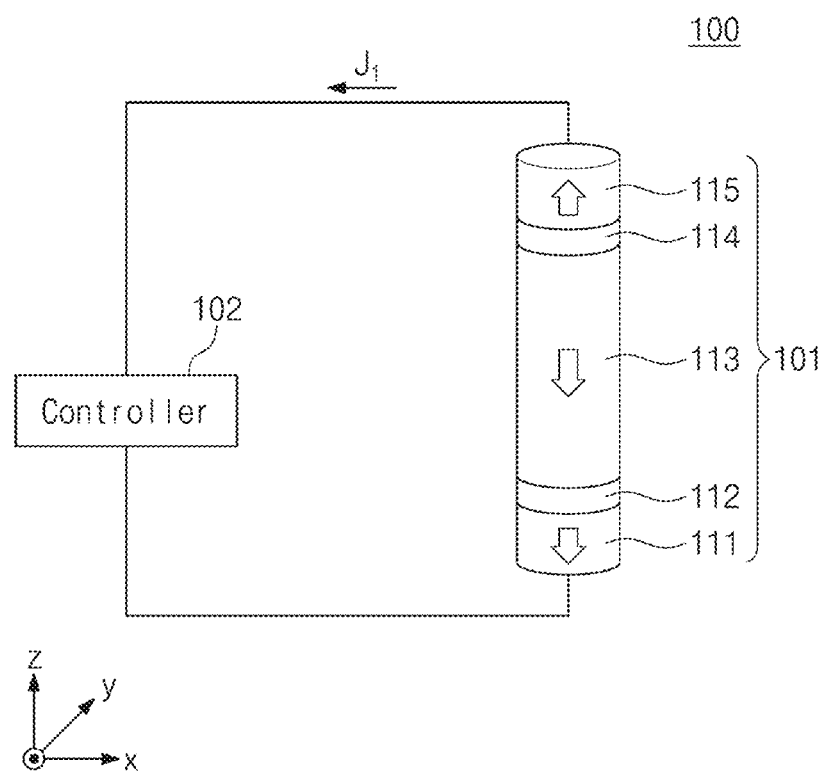
FIG. 2 illustrates an operation of a magnetic memory device.

FIG. 2 illustrates the magnetic memory device 100 before a data writing operation. In FIG. 2, the free layer 113 serving as a data writing portion may have a downward magnetization. The first fixed layer 111 may have a downward magnetization direction. The second fixed layer 115 may have an upward magnetization direction. In this state, to write an upward magnetization in the free layer 113, the controller 102 may produce a current $J_1$ flowing from the first fixed layer 111 to the second fixed layer 115.

Figure 3:
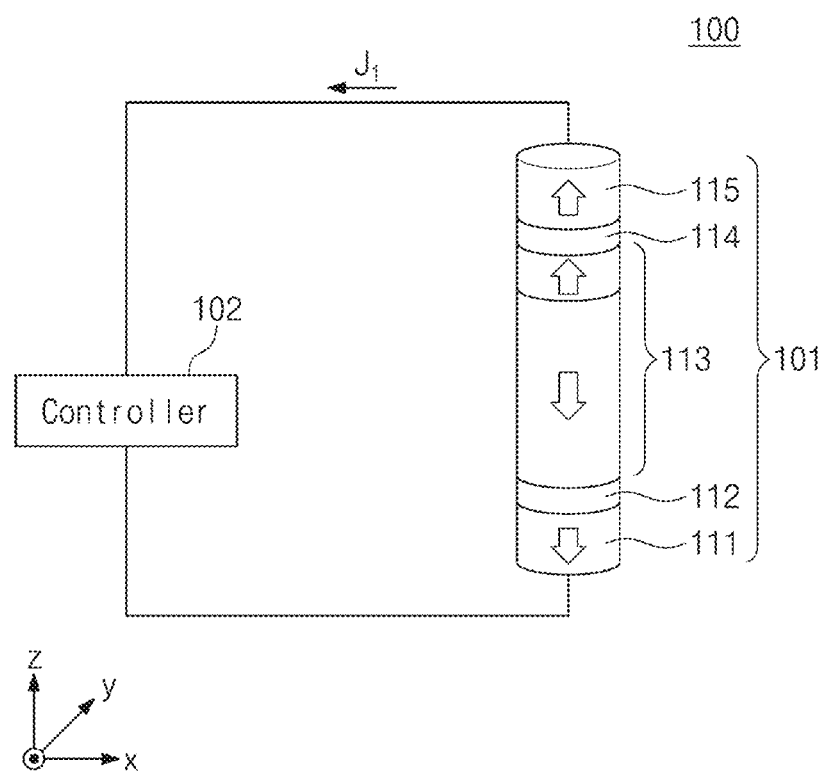
FIG. 3 illustrates an operation of a magnetic memory device.

FIG. 3 illustrates a state of the magnetic memory device 100 after producing the current $J_1$ in FIG. 2. Referring to FIG. 3, in the case where the current $J_1$ flows through the magnetic memory device 101, a spin having an upward magnetic moment may be injected from the second fixed layer 115 into the free layer 113, because a flow of an electron is opposite to a direction of a current, and as a result, an upward magnetization region may occur in the free layer 113 adjacent to the second non-magnetic layer 114. Furthermore, due to the flow of the current $J_1$ passing through the magnetic memory device 101, a domain wall, which is located at an interface between upward and downward magnetization regions, may be moved from a region close to the second non-magnetic layer 114 toward another region close to the first non-magnetic layer 112. For convenience in description, the spin having the upward magnetic moment may be called "up spin", and the spin having the downward magnetic moment may be called "down spin".

Figure 4:
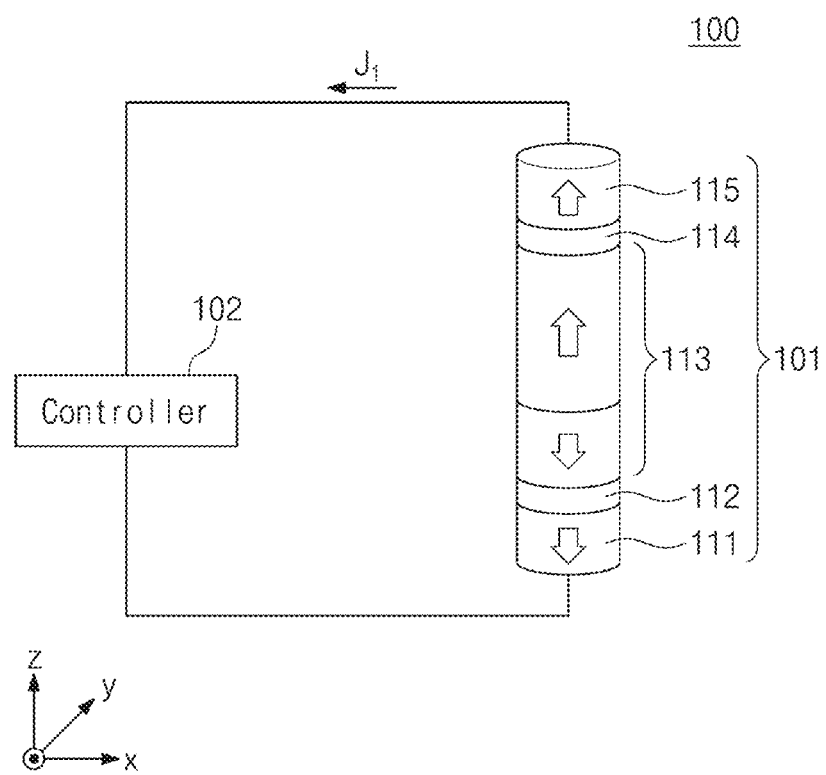
FIG. 4 illustrates an operation of a magnetic memory device.

FIG. 4 illustrates a state of the magnetic memory device 100 after producing the current $J_1$ in FIG. 3. Referring to FIG. 4, due to the flow of the current $J_1$ passing through the magnetic memory device 101, the domain wall may be further moved toward the first non-magnetic layer 112.

Figure 5:
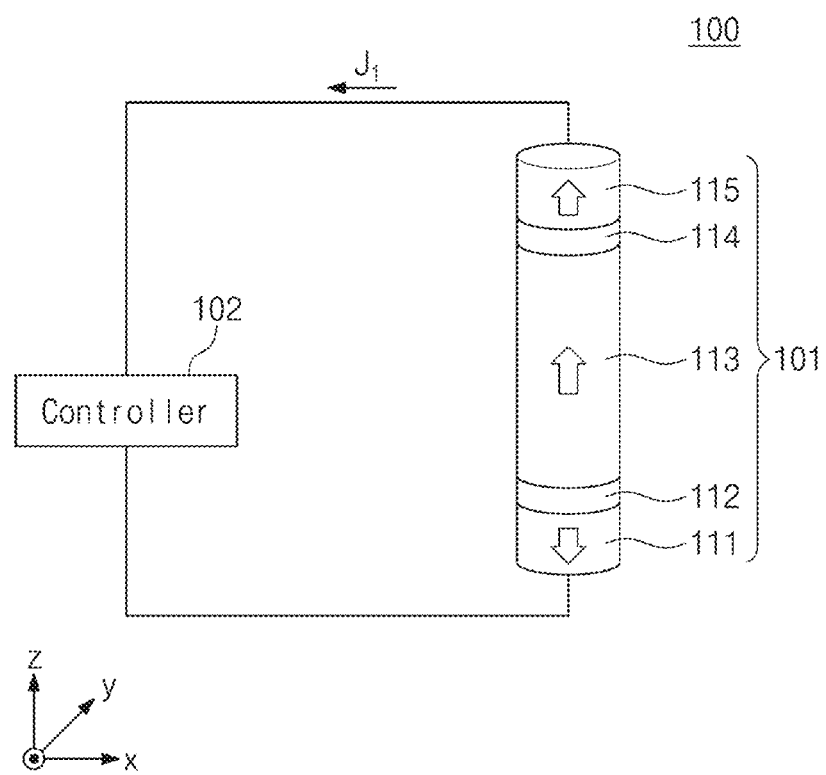
FIG. 5 illustrates an operation of a magnetic memory device.

FIG. 5 illustrates a state of the magnetic memory device 100 after producing the current $J_1$ in FIG. 4. Referring to FIG. 5, in the case where the current $J_1$ flows through the magnetic memory device 101, the domain wall may reach the first non-magnetic layer 112, and as a result, the entirety of the free layer 113 may have the upward magnetization.

The upward magnetization may be written in the free layer 113 through the afore-described process. Next, an example method of writing a downward magnetization in the free layer 113 will be described with reference to FIGS. 6 to 9.

Figure 6:
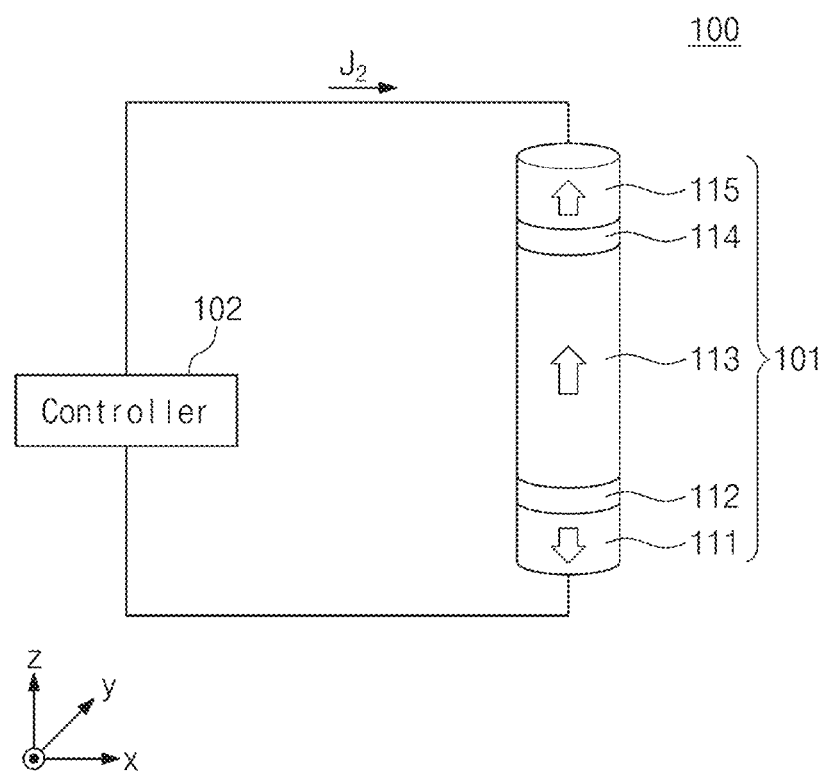
FIG. 6 illustrates an operation of a magnetic memory device.

FIG. 6 illustrates the magnetic memory device 100 before the data writing operation. Referring to FIG. 6, the free layer 113 may have an upward magnetization. In addition, the first fixed layer 111 may have a downward magnetization direction. The second fixed layer 115 may have an upward magnetization direction. In this state, to write a downward magnetization in the free layer 113, the controller 102 may produce a current $J_2$ flowing from the second fixed layer 115 to the first fixed layer 111.

Figure 7:
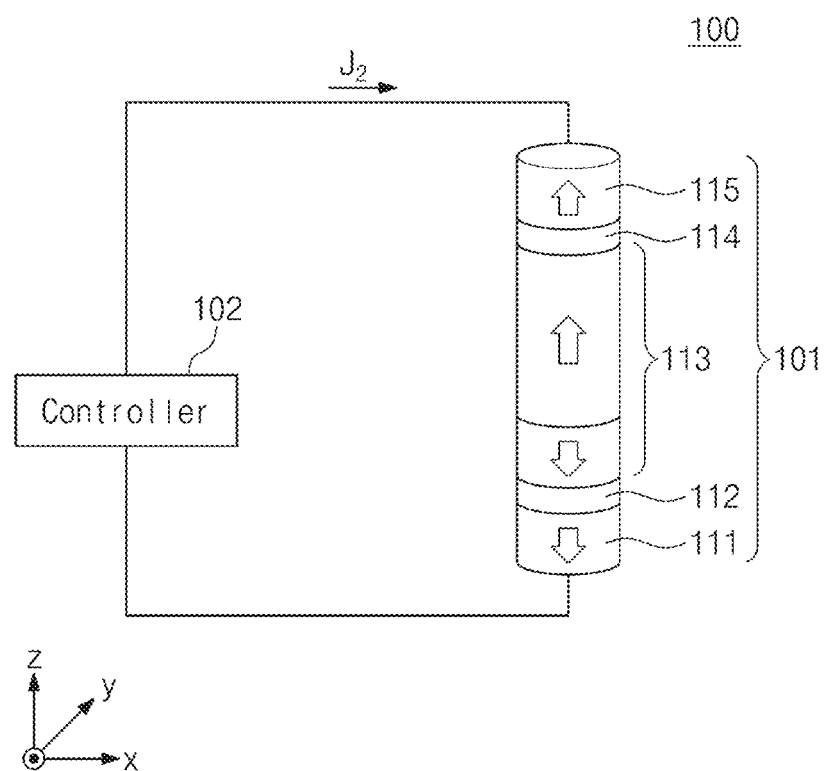
FIG. 7 illustrates an operation of a magnetic memory device.

FIG. 7 illustrates a state of the magnetic memory device 100 after producing the current $J_2$ in FIG. 6. Referring to FIG. 7, in the case where the current $J_2$ flows through the magnetic memory device 101, a down spin may be injected from the first fixed layer 111 into the free layer 113, and a downward magnetization region may occur in the free layer 113 adjacent to the first non-magnetic layer 112. In addition, due to the flow of the current $J_2$ passing through the magnetic memory device 101, a domain wall, which is located at an interface between upward and downward magnetization regions, may be moved from a region close to the first non-magnetic layer 112 toward a region close to the second non-magnetic layer 114.

Figure 8:
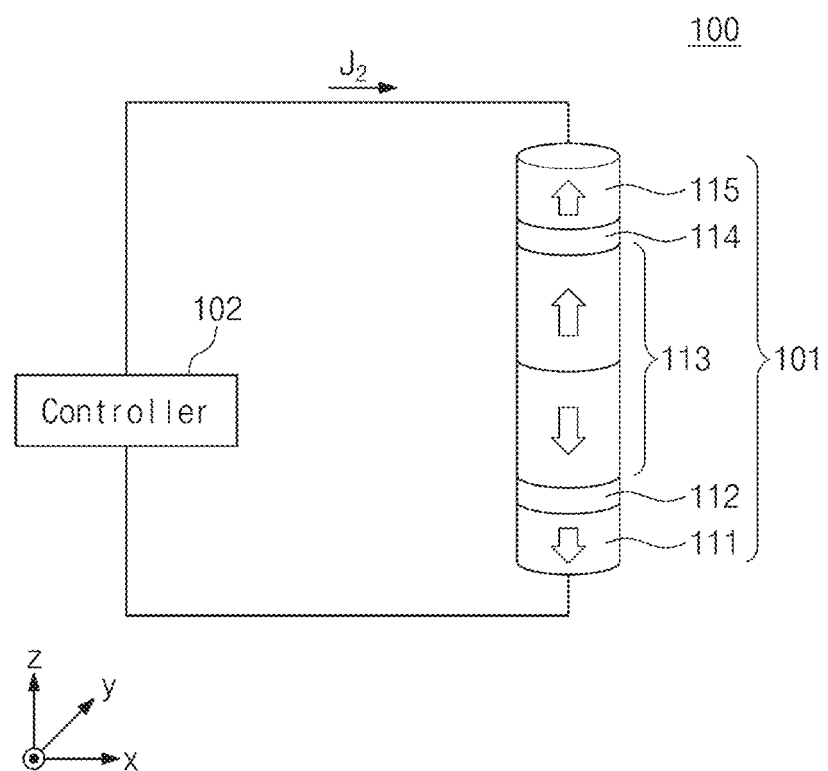
FIG. 8 illustrates an operation of a magnetic memory device.

FIG. 8 illustrates a state of the magnetic memory device 100 after producing the current $J_2$ in FIG. 7. Referring to FIG. 8, due to the flow of the current $J_2$ passing through the magnetic memory device 101, the domain wall may be further moved toward the second non-magnetic layer 114.

Figure 9:
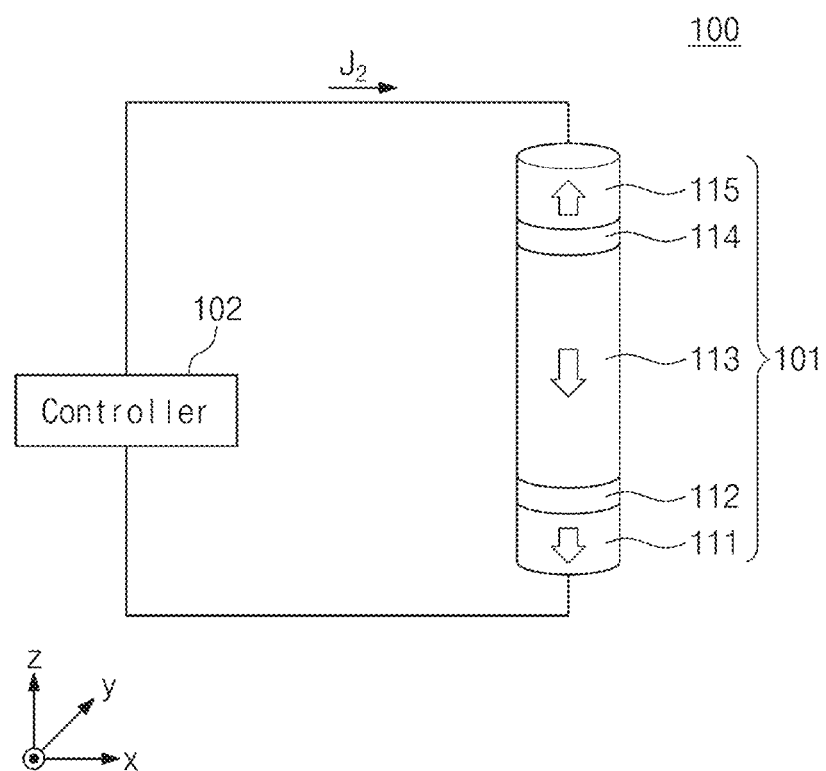
FIG. 9 illustrates an operation of a magnetic memory device.

FIG. 9 illustrates a state of the magnetic memory device 100 after producing the current $J_2$ in FIG. 8. Referring to FIG. 9, due to the flow of the current $J_2$ passing through the magnetic memory device 101, the domain wall may reach the second non-magnetic layer 114, and as a result, the entirety of the free layer 113 may have the downward magnetization. The downward magnetization may be written in the free layer 113 through the afore-described method.

Figure 10:
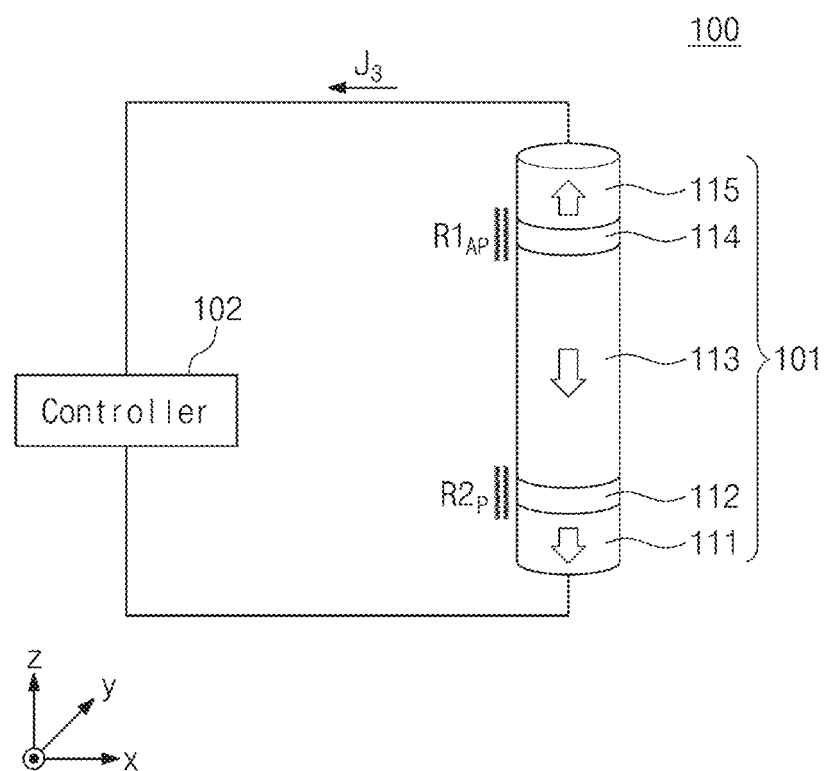
FIG. 10 illustrates an operation of a magnetic memory device.
Figure 11:
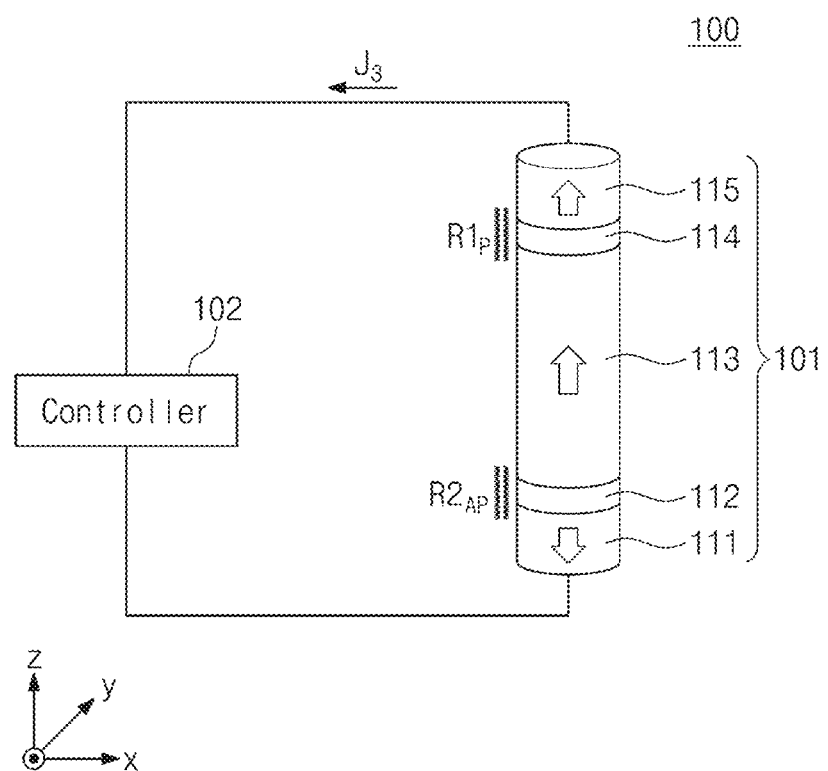
FIG. 11 illustrates an operation of a magnetic memory device.

Next, an operation of reading data from the magnetic memory device 101 using the controller 102 will be described. The controller 102 may determine whether the magnetic memory device 101 is in a state of the upward or downward magnetization, based on a magnitude of a current flowing through the magnetic memory device 101. FIGS. 10 and 11 illustrate an operation, which is performed on a magnetic memory device, according to an embodiment of the inventive concept.

The controller 102 may measure a value of a read current $J_3$. The read current $J_3$ may have a value that is smaller than both of the write currents $J_1$ and $J_2$. In addition, the read current $J_3$ may not be limited to a specific direction.

First of all, an example method of reading the downward magnetization will be described in more detail with reference to FIG. 10. The free layer 113, the second non-magnetic layer 114, and the second fixed layer 115 may form a TMR device. In FIG. 10, since a magnetization direction of the second fixed layer 115 is antiparallel to a magnetization direction of the free layer 113, the upper TMR device (e.g., MR1 to be described below) may have an anti-parallel magnetoresistance $R1_{AP}$. In addition, the first fixed layer 111, the first non-magnetic layer 112, and the free layer 113 may form a TMR device. In FIG. 10, since the first fixed layer 111 has the same magnetization direction as the free layer 113, the lower TMR device (e.g., MR2 to be described below) may have a parallel magnetoresistance $R2_P$. Here, when the free layer 113 has the downward magnetization, a resistance value $R_{down}$ of the magnetic memory device 101 may be substantially equal to $R1_{AP}+R2_P$.

An example method of reading the upward magnetization will be described in more detail with reference to FIG. 11. Referring to FIG. 11, since the second fixed layer 115 has the same magnetization direction as the free layer 113, the upper TMR device (e.g., MR1 to be described below) may have a parallel magnetoresistance $R1_P$. In addition, in FIG. 11, since the first fixed layer 111 has a magnetization direction antiparallel to that of the free layer 113, the lower TMR device (e.g., MR2 to be described below) may have an anti-parallel magnetoresistance $R2_{AP}$. Here, when the free layer 113 has the upward magnetization, a resistance value $R_{UP}$ of the magnetic memory device 101 may be substantially equal to $R1_P+R2_{AP}$.

Since there is a difference between the resistance values $R_{down}$ and $R_{UP}$ of the magnetic memory device, which are respectively given when the free layer 113 has the downward and upward magnetizations, the controller 102 may determine whether the magnetic memory device 101 is in a state of the upward or downward magnetization, based on a magnitude of the current, which is produced when a fixed voltage is applied to the magnetic memory device 101.

The description that follows will refer to an example, in which the resistance value $R_{down}$ of the free layer 113 having the downward magnetization is different from the resistance value $R_{UP}$ of the free layer 113 having the upward magnetization.

If MR1 and MR2 are supposed to have the same magnetoresistance (MR) ratio, the magnetoresistance values may satisfy the following equations. Here, $MR1 \equiv (R1_{AP}-R1_P)/R1_P$ and $MR2 \equiv (R2_{AP}-R2_P)/R2_P$.

$$\alpha R1_P = R1_{AP}$$

$$\alpha R2_P = R2_{AP}$$

where $\alpha$ is a coefficient corresponding to a MR ratio, and $R2_P$ is supposed to be $\beta$ times $R1_P$ (i.e., $\beta R1_P = R2_P$). That is, $\beta$ is a ratio between resistance values $R1_P$ and $R2_P$. Then, the equation may be rewritten as follows:

$$\alpha \beta R1_P = R2_{AP}.$$

A ratio between the resistance value $R_{UP}$ of the free layer 113 having the upward magnetization and the resistance value $R_{down}$ of the free layer 113 having the downward magnetization may be given as follows:

$$R_{UP}/R_{down}=(1+\alpha\beta)/(\alpha+\beta)$$

Here, $R_{UP}/R_{down} \neq 1$, when $\beta \neq 1$.

That is, when the resistance values of $R1_P$ and $R2_P$ are different from each other, the resistance value $R_{UP}$ of the free layer 113 having the upward magnetization may differ from the resistance value $R_{down}$ of the free layer 113 having the downward magnetization. As a result, the controller 102 may determine whether the magnetic memory device 101 is in a state of the upward or downward magnetization, based on a magnitude of the current passing through the magnetic memory device 101.

In an embodiment, the device MR1, which is composed of the free layer 113, the second non-magnetic layer 114, and the second fixed layer 115, may be a GMR device, the device MR2, which is composed of the first fixed layer 111, the first non-magnetic layer 112, and the free layer 113, may be a TMR device. In this case, the device MR2 may have a large resistance value and a large magnetoresistance value.

Figure 12:
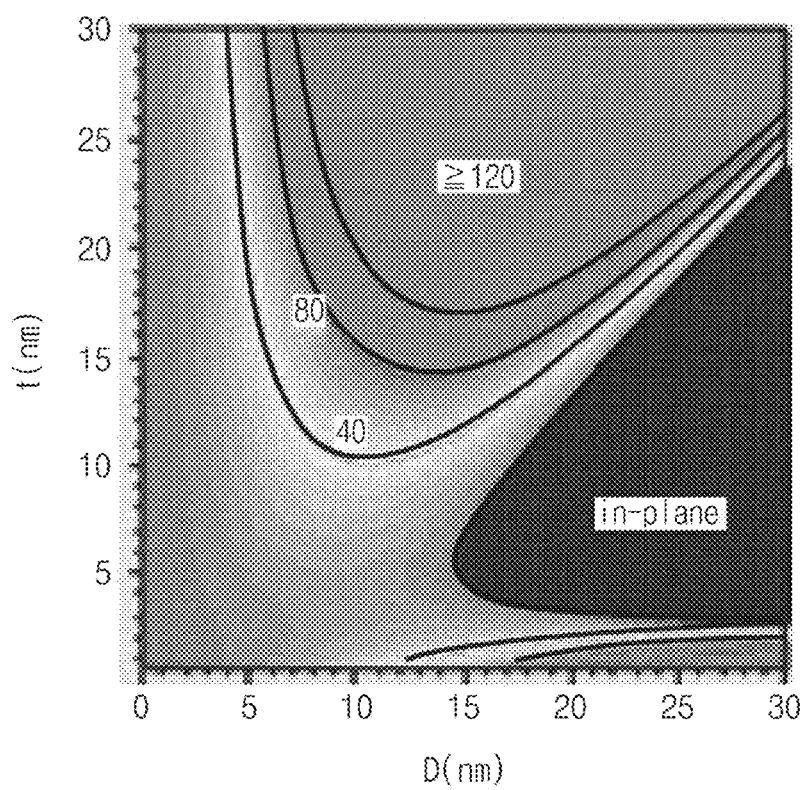
FIG. 12 is a graph showing a relationship between a structure of an MTJ device in a magnetic memory device and thermal stability thereof.

FIG. 12 is a graph showing a relationship between a structure of an MTJ device and thermal stability thereof, in a magnetic memory device according to an embodiment of the inventive concept. In FIG. 12, the horizontal axis represents a thickness (t) of the free layer 113, and the vertical axis represents a diameter (D) of a device.

In FIG. 12, a combination of thickness and diameter, resulting in a large thermal stability factor Δ, may be suitable for the structure of the free layer. For example, referring to FIG. 12, combinations of thickness and diameter giving the thermal stability factor Δ of 40 or greater may be desirable. In particular, combinations of thickness and diameter giving the thermal stability factor Δ of 80 or greater may be desirable. Furthermore, combinations of thickness and diameter giving the thermal stability factor Δ of 120 may be most desirable.

In an embodiment, the free layer 113 may be provided such that a ratio of its height to its diameter is equal to or greater than 1. Furthermore, the height of the free layer 113 may be equal to or larger than 20 nm. The diameter of the free layer 113 may be equal to or less than 10 nm.

In the magnetic memory device according to an embodiment of the inventive concept, by using a domain wall movement phenomenon, it may be possible to provide a magnetic tunnel junction device, which has a two-terminal structure and high reliability (e.g., without a thermal stability deterioration issue even in a wide operation temperature range of −40° C.-+150° C.) or moreover a MRAM product or alternative of DRAM products. In the magnetic memory device according to the present embodiment, since a material with low saturation magnetization (Ms) property is used as the free layer, it may be possible to achieve a high speed writing operation (e.g., several ns) and a reduction of consumption current. Furthermore, in the magnetic memory device according to an embodiment of the inventive concept, since the free layer is formed to have an elongated shape, it may be possible to secure thermal stability, which has been hardly achieved in a conventional technology, using a shape magnetic anisotropy and to realize a highly-integrated device whose size is less than 10 nm. In particular, it may be possible to realize a magnetic tunnel junction device, which has not a thermal stability deterioration issue even in a wide operation temperature range of −40° C.-+150° C.

In addition, the inventive concept is not limited to a specific embodiment, and the embodiment may be modified unless such modification is departed from the gist of the inventive concept. For example, a structure, in which the first fixed layer 111, the first non-magnetic layer 112, and the free layer 113 are provided to constitute a TMR device, has been described the above embodiment, but a GMR device, in which a non-magnetic metal layer, instead of an insulating layer, is used as the first non-magnetic layer 112, may be used to realize the inventive concept. Similarly, the free layer 113, the second non-magnetic layer 114, and the second fixed layer 115 may be used as the GMR device.

Furthermore, in the above embodiment or in FIG. 1, the first fixed layer 111, the first non-magnetic layer 112, the free layer 113, the second non-magnetic layer 114, and the second fixed layer 115 are illustrated to have a circular pillar shape, but if the layers can be stacked, the inventive concept is not limited to a specific shape of the layers. For example, each of the stacked layered may have a rectangular shape.

Embodiment 1

Figure 13:
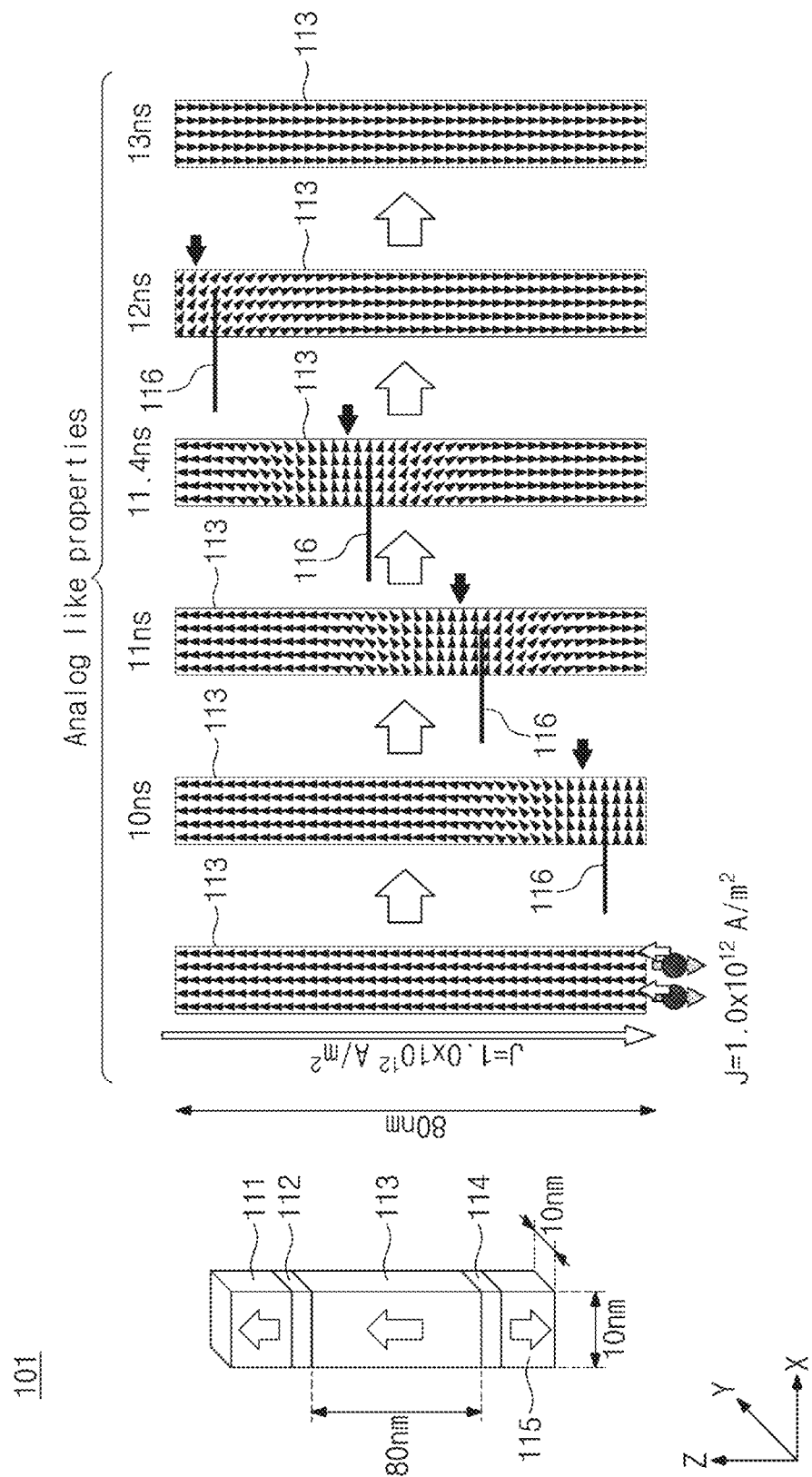
FIG. 13 illustrates movement of a domain wall in a magnetic memory device according to an embodiment of the inventive concept.

In the magnetic memory device 101, a current flowing through the device may lead to a movement of the domain wall, as described above. In the present embodiment, by applying a current pulse to the magnetic memory device 101, the magnetic memory device 101 may be used as an analog memory device allowing for a write restoration in multi-valued manner. This may will be described in more detail with reference to FIG. 13. FIG. 13 shows simulation results on movements of a domain wall in the free layer 113 of the magnetic memory device 101.

The magnetic memory device 101 may be a square-shaped structure, which has an area of 10 nm×10 nm, when viewed in an xy-plane, a size of. In addition, a length of the free layer 113 in a Z direction may be 80 nm. FIG. 13 illustrates a motion of a domain wall 116 in the free layer 113, with the lapse of time.

When the system is in an initial state before flowing a current, the free layer 113 may have an upward magnetization direction. A current (e.g., having a current density $J=1.0 \times 10^{12}$ A/m$^2$) may flow through the magnetic memory device 101. A direction of the current flow may be a downward direction (e.g., −Z direction). Thus, the domain wall 116 may be gradually moved from a lower region (e.g., close to the second non-magnetic layer 114) to an upper region (e.g., close to the first non-magnetic layer 112). After 13 ns, the domain wall 116 may be moved to the first non-magnetic layer 112 such that the magnetization direction of the free layer 113 is changed to a downward direction.

If a current pulse is applied to pass through the magnetic memory device 101, a position of the domain wall 116 may be changed, depending on the number of the applied pulses. In the example shown in FIG. 13, as the number of the applied pulses increases, the domain wall 116 may be moved in an upward direction. By counting the number of the current pulses supplied to the magnetic memory device 101, the magnetic memory device 101 may be used as an analog memory device. For example, if the magnetization direction of the free layer 113 can be reversed using 256 pulses, the magnetic memory device 101 may be regarded as an 8 bit analog memory device.

Figure 14:
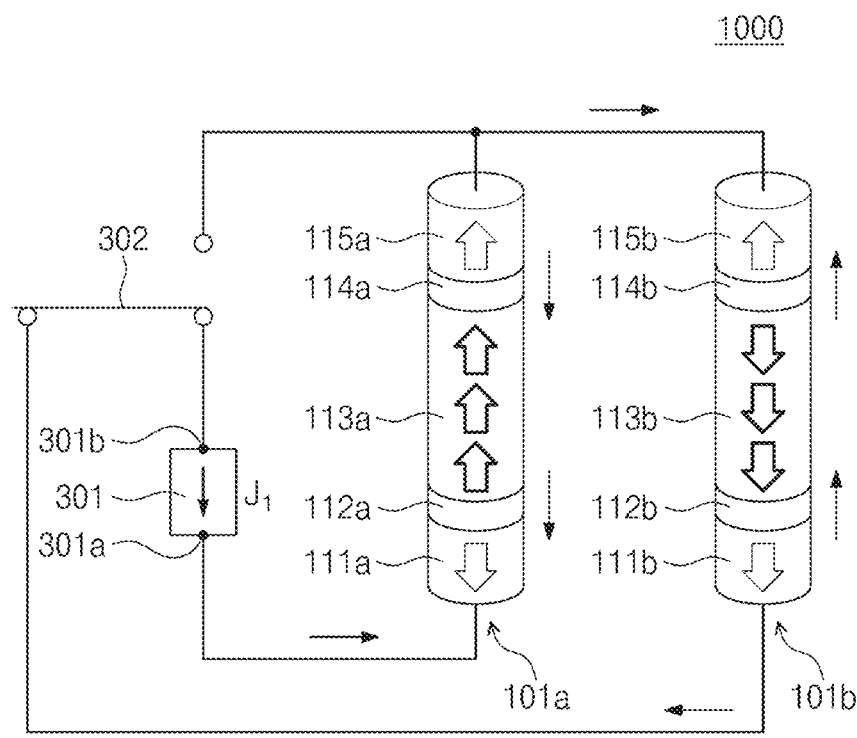
FIG. 14 illustrates an erase operation on a magnetic memory device according to an embodiment of the inventive concept.

A magnetic memory device 1000 according to a first embodiment and an operation thereof will be described in more detail with reference to FIGS. 14 to 17. FIGS. 14 to 17 illustrate some structures of the magnetic memory device 1000. FIG. 14 illustrates an erase or initialization operation which is performed before a data write operation, and FIG.

Figure 16:
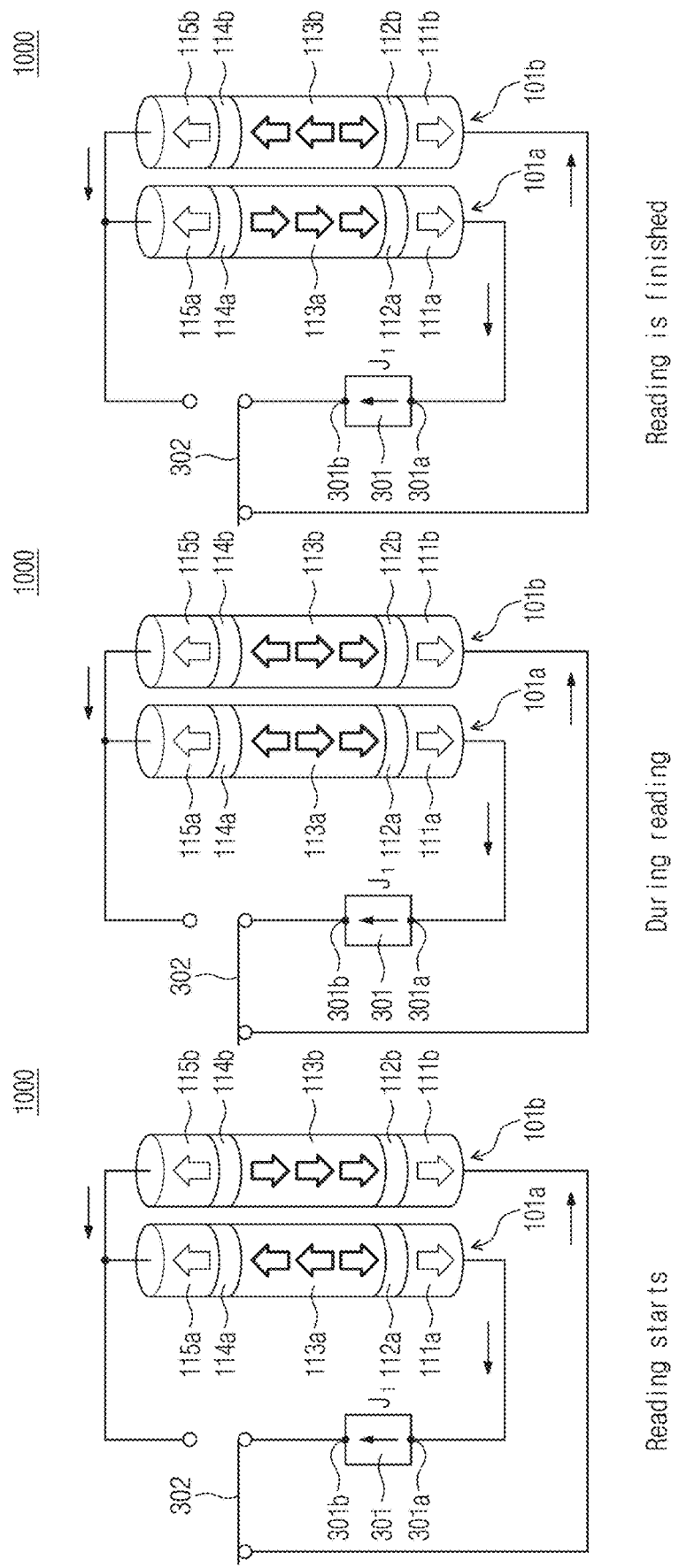
FIG. 16 illustrates a first reading operation on a magnetic memory device according to an embodiment of the inventive concept.
Figure 17:
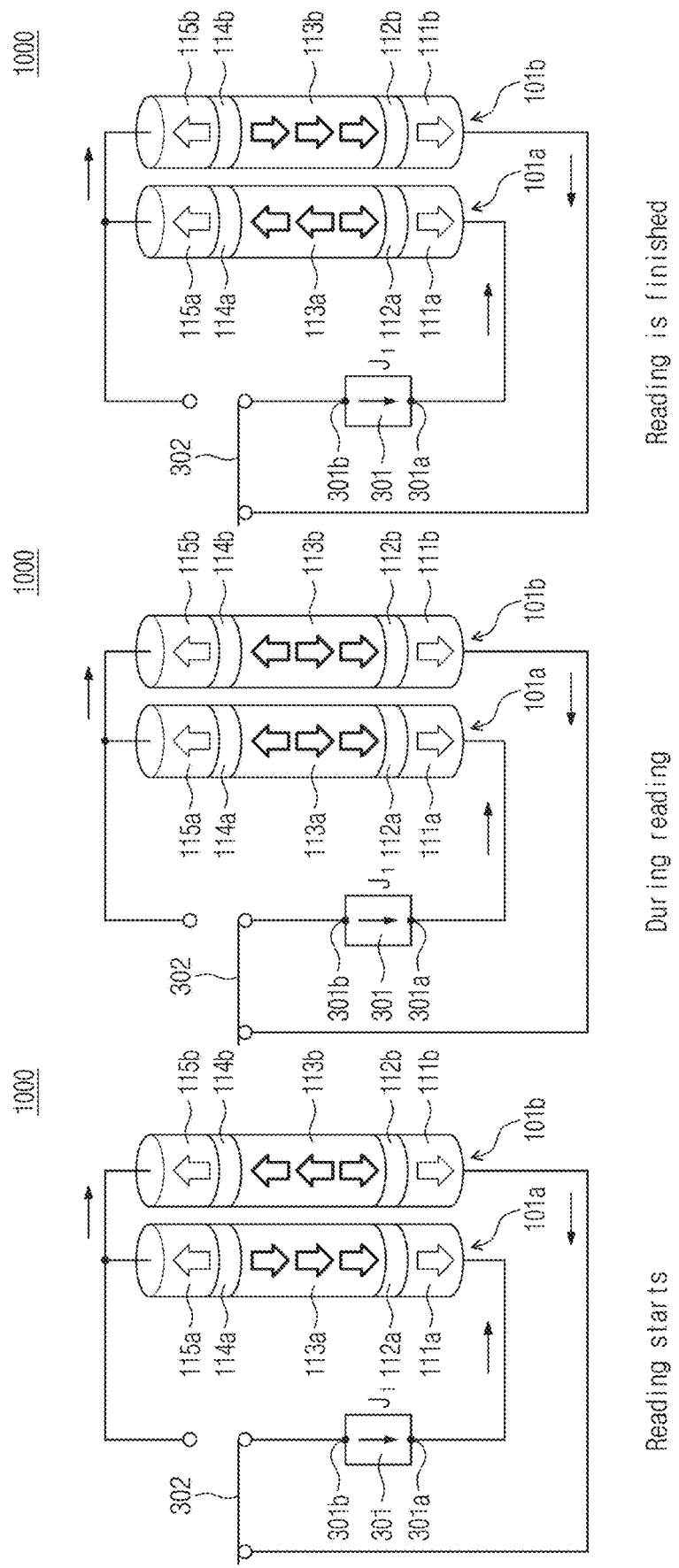
FIG. 17 illustrates a second reading operation on a magnetic memory device according to an embodiment of the inventive concept.

15 illustrates the data write operation. FIGS. 16 and 17 illustrate data reading operations. In an embodiment, the first reading operation shown in FIG. 16 and the second reading operation shown in FIG. 17 may be alternately performed.

The magnetic memory device 1000 may include two magnetic memory devices 101, each of which is configured to have the afore-described structure. Hereinafter, such two magnetic memory devices 101 will be referred to as a first magnetic memory device 101a and a second magnetic memory device 101b, respectively. The magnetic memory device 1000 of FIGS. 14 and 15 may include a pulse power 301 and a switch 302. The pulse power 301 and the switch 302 may correspond to the controller 102.

As described above, the first magnetic memory device 101a may have a stacking structure, in which a first fixed layer 111a, a first non-magnetic layer 112a, a free layer 113a, a second non-magnetic layer 114a, and a second fixed layer 115a are sequentially stacked. Similarly, the second magnetic memory device 101b may have a stacking structure, in which the first fixed layer 111b, the first non-magnetic layer 112b, the free layer 113b, the second non-magnetic layer 114b, and the second fixed layer 115b are sequentially stacked. The first and second magnetic memory devices 101a and 101b may have substantially the same device structure. For example, each layer in the first magnetic memory device 101a may be the same as a corresponding layer in the second magnetic memory device 101b in terms of material, thickness, magnetoresistance, and so forth.

The first and second magnetic memory devices 101a and 101b may be disposed to be parallel to each other. The second fixed layer 115a of the first magnetic memory device 101a may be connected to the second fixed layer 115b of the second magnetic memory device 101b. The first fixed layer 111a of the first magnetic memory device 101a may be connected to the pulse power 301. The first fixed layer 111b of the second magnetic memory device 101b may be connected to the switch 302. In addition, the second fixed layer 115a and the second fixed layer 115b may be connected to the switch 302.

The pulse power 301 may be configured to produce a current pulse (or a driving pulse) and to supply it to the first and second magnetic memory devices 101a and 101b. In detail, the pulse power 301 may have two outputs 301a and 301b and may be used to reverse a current direction of the current pulse. For example, in the drawings, the arrows, which are depicted in the pulse power 301 or along the wire, represent the current direction. One (e.g., 301a) of the outputs of the pulse power 301 may be connected to the first fixed layer 111a of the first magnetic memory device 101a. The other (e.g., 301b) of the outputs of the pulse power 301 may be connected to the switch 302.

Figure 15:
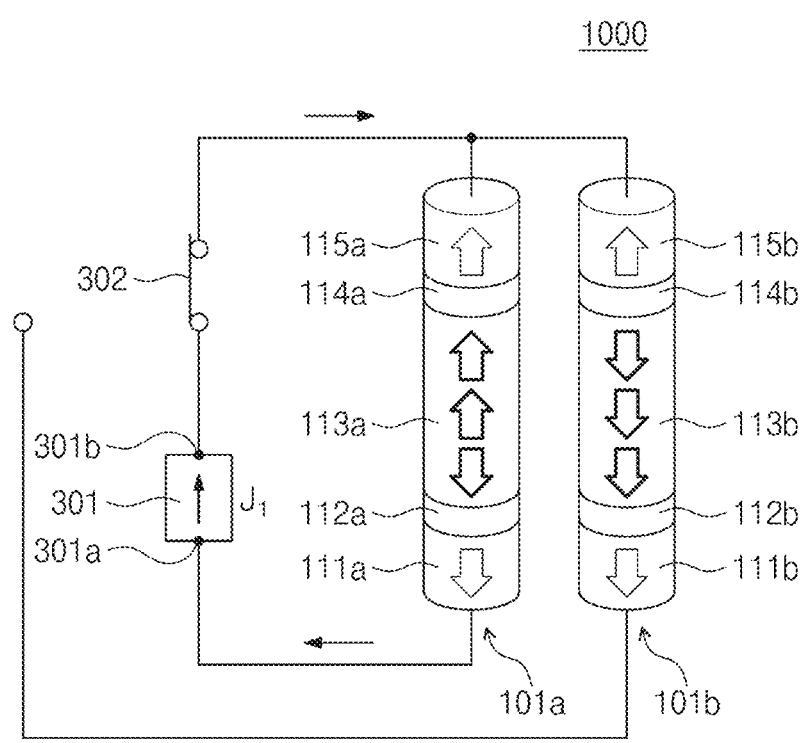
FIG. 15 illustrates a write operation on a magnetic memory device according to an embodiment of the inventive concept.

The switch 302 may be configured to selectively connect the pulse power 301 to one of the first and second magnetic memory devices 101a and 101b. The switch 302 may be configured to perform a switching operation of selectively connecting the output 301b of the pulse power 301 to the second fixed layer 115a of the first magnetic memory device 101a or the first fixed layer 111b of the second magnetic memory device 101b. For example, in FIGS. 14, 16, and 17, the output 301b of the pulse power 301 may be connected to the first fixed layer 111b of the second magnetic memory device 101b through the switch 302. In FIG. 15, the output 301b of the pulse power 301 may be connected to the second fixed layer 115a and the second fixed layer 115b through the switch 302. Hereinafter, an erase operation, a write operation, and a reading operation will be described in more detail.

(Erase Operation)

In an erase or initialization operation shown in FIG. 14, the output 301b of the pulse power 301 may be connected to the first fixed layer 111b of the second magnetic memory device 101b through the switch 302. The pulse power 301 may output a current pulse to the first fixed layer 111a of the first magnetic memory device 101a. In other words, the current pulse may be supplied from the output 301a of the pulse power 301.

Thus, in the first magnetic memory device 101a, the current pulse may flow from the first fixed layer 111a to the second fixed layer 115a. In addition, the current pulse may flow from the second fixed layer 115a of the first magnetic memory device 101a to the second fixed layer 115b of the second magnetic memory device 101b. In the second magnetic memory device 101b, the current pulse may flow from the second fixed layer 115b to the first fixed layer 111b.

Here, the first magnetic memory device 101a may be an 8 bit analog memory and a magnetization direction thereof may be reversed by 256 pulses. The second magnetic memory device 101b may be an 8 bit analog memory, like the first magnetic memory device 101a, and a magnetization direction thereof may be supposed to be reversed by 256 pulses. In other words, in each of the first and second magnetic memory devices 101a and 101b, 256 pulses may constitute a full scale. The first and second magnetic memory devices 101a and 101b may be the same as each other in terms of the number of the pulses constituting the full-scale. Here, the number of the pulses constituting the full-scale is not limited to 256. As long as the number of the pulses constituting the full-scale is predetermined, it is sufficient.

During the erase operation, the pulse power 301 may supply current pulses which are more than two times the full-scale. Accordingly, a magnetization direction of the free layer 113a may have a direction (hereinafter, an up or upward direction) from the first non-magnetic layer 112a toward the second non-magnetic layer 114a. In other words, the entirety of the free layer 113a may have the upward magnetization direction. A magnetization direction of the second magnetic memory device 101b may have a direction (hereinafter, a down or downward direction) from the second non-magnetic layer 114b toward the first non-magnetic layer 112b. In other words, the entirety of the free layer 113b may have the downward magnetization direction.

If a domain wall in the first magnetic memory device 101a is moved to the first non-magnetic layer 112a and a domain wall in the second magnetic memory device 101b is moved to the second non-magnetic layer 114b, the erase operation may be finished. FIG. 14 illustrates magnetization states of the free layers 113a and 113b when the erase operation is finished. In FIG. 14, white arrows in the free layers 113a and 113b may represent the magnetization directions. In FIG. 14, arrows, which are drawn on the right side of each of the first and second magnetic memory devices 101a and 101b, may represent a direction of spin flow. The direction of spin flow may be opposite to the direction of the current and thus may be omitted from figures after FIG. 15.

(Write Operation)

During the write operation shown in FIG. 15, the output 301b of the pulse power 301 may be connected to the second fixed layer 115a of the first magnetic memory device 101a through the switch 302. The pulse power 301 may output a current pulse to the second fixed layer 115a of the first magnetic memory device 101a. In other words, the current pulse may be supplied from the output 301b of the pulse power 301. During the write operation of FIG. 15, the connection of the switch 302 and the direction of the current may be opposite to those in the initialization operation of FIG. 14.

In the first magnetic memory device 101a, the current pulse may flow from the second fixed layer 115a to the first fixed layer 111a. Since the first fixed layer 111b of the second magnetic memory device 101b is opened, the current pulse may not pass through the second magnetic memory device 101b.

In the write operation, the number of the current pulse supplied by the pulse power 301 may be determined based on a data value to be written. For example, the pulse power 301 may be configured to supply 1 to 256 current pulses. In the first magnetic memory device 101a, a domain wall may be moved from a region close to the first non-magnetic layer 112a to a region close to the second non-magnetic layer 114a. In an embodiment, the domain wall may be moved to a position in the free layer 113a corresponding to the number of the pulses. Since the current pulse does not flow toward the second magnetic memory device 101b, the entirety of the free layer 113b may be maintained to the downward magnetization direction.

(First Reading Operation)

During the first reading operation shown in FIG. 16, the output 301b of the pulse power 301 may be connected to the first fixed layer 111b of the second magnetic memory device 101b through the switch 302. In addition, the pulse power 301 may output a current pulse to the first fixed layer 111b of the second magnetic memory device 101b. In other words, the current pulse may be supplied from the output 301b of the pulse power 301. During the first reading operation of FIG. 16, the connection of the switch 302 may be the same as that in the erase operation of FIG. 14 and the direction of the current may be opposite to that in the erase operation of FIG. 14.

Accordingly, in the second magnetic memory device 101b, a current pulse may flow from the first fixed layer 111b to the second fixed layer 115b. In addition, the current pulse may flow from the second fixed layer 115b of the second magnetic memory device 101b to the second fixed layer 115a of the first magnetic memory device 101a. In the first magnetic memory device 101a, the current pulse may flow from the second fixed layer 115a to the first fixed layer 111a.

During the first reading operation, the pulse power 301 may supply the current pulse to the first magnetic memory device 101a until the entirety of the free layer 113a has the downward magnetization direction. In other words, a domain wall in the free layer 113a may be gradually moved in an upward direction, and a domain wall in the free layer 113b may be moved in a downward direction. Thereafter, in the first magnetic memory device 101a, if the domain wall is moved to the second non-magnetic layer 114a and the entire magnetization direction becomes the downward direction, the reading operation may be terminated.

When compared with an initial state before the reading operation, magnetization states of the free layers 113a and 113b may be changed (for example, exchanged), after the reading operation. That is, the domain wall in the free layer 113a in the write operation of FIG. 15 and the domain wall in the free layer 113b after the first reading operation of FIG. 16 may be located at a position corresponding to the same number of pulses. Accordingly, data, which is written in the free layer 113a, may be transferred to the free layer 113b.

Since, as described above, the resistance value $R_{down}$ when the free layer 113a has the downward magnetization is different from the resistance value $R_{UP}$ when it has the upward magnetization, it may be possible to detect that the magnetization direction of the first magnetic memory device 101a is downward. In other words, the resistance value of $R1_P$ may differ from the resistance value of $R2_P$. Furthermore, the resistance value $R_{u}p$ of the free layer 113a having the upward magnetization may become different from the resistance value $R_{down}$ of the free layer 113a having the downward magnetization. As a result, the controller 102 may determine whether the magnetic memory device 101 is in a state of the upward or downward magnetization, based on a magnitude of the current passing through the magnetic memory device 101.

In addition, the magnetic memory device 1000 may count the number of pulses applied until the magnetization direction of the free layer 113a becomes downward. The magnetic memory device 1000 may restore (or output) an analog value (or multi-valued data) by subtracting the number of applied pulses from the full-scale pulse number.

For example, the number of the full-scale pulses may be 256 pulses. In the first reading operation, the number of pulses, which are applied until a magnetization direction of the free layer 113a of the first magnetic memory device 101a becomes downward, may be 100. In this case, a data value, which is written in the magnetic memory device 1000, may be 156=256−100.

(Second Reading Operation)

During the second reading operation shown in FIG. 17, the output 301b of the pulse power 301 may be connected to the first fixed layer 111b of the second magnetic memory device 101b through the switch 302. The pulse power 301 may output a current pulse to the first fixed layer 111a of the first magnetic memory device 101a. In other words, the current pulse may be supplied from the output 301a of the pulse power 301. During the second reading operation of FIG. 17, the connection of the switch 302 and the direction of the current may be opposite to those in the first reading operation of FIG. 16.

During the second reading operation, the pulse power 301 may supply the current pulse to the second magnetic memory device 101b until the entirety of the free layer 113b has the downward magnetization direction. That is, in the free layer 113b, the domain wall may be gradually moved in an upward direction, and in the free layer 113a, the domain wall may be moved in a downward direction. Thereafter, in the second magnetic memory device 101b, if the domain wall in the free layer 113b is moved to the first non-magnetic layer 112b and the entire magnetization direction becomes the downward direction, the reading operation may be terminated.

When compared with an initial state before the reading operation, magnetization states of the free layers 113a and 113b may be changed (for example, exchanged), after the reading operation. In other words, the state in the write operation of FIG. 15 may be the same as the state obtained after the second reading operation of FIG. 17 is finished. Accordingly, data, which is written in the free layer 113b, may be transferred to the free layer 113a.

Since, as described above, the resistance value $R_{down}$ when the free layer 113b has the downward magnetization is different from the resistance value $R_{u}p$ when it has the upward magnetization, it may be possible to detect that the magnetization direction of the second magnetic memory device 101b is downward. In addition, the magnetic memory device 1000 may count the number of pulses applied until the magnetization direction of the free layer 113*b* becomes downward. The magnetic memory device 1000 may restore (or output) an analog value (or multi-valued data) by subtracting the number of applied pulses from the full-scale pulse number.

The data read operation may be repeated in a manner of alternately performing the first reading operation shown in FIG. 16 and the second reading operation shown in FIG. 17. For example, in the first reading operation, an analog value (or multi-valued data), which is written in the first magnetic memory device 101*a*, may be transferred to the second magnetic memory device 101*b*. In the second reading operation, an analog value (or multi-valued data), which is written in the second magnetic memory device 101*b*, may be transferred to the first magnetic memory device 101*a*. By using this method, it may be possible to repeatedly read out data, without data loss. Thus, it may be possible to realize a memory device, which has a high speed reading property and a nonvolatile property. In addition, by changing the connection of the switch 302 and the current direction of the pulse power 301, it may be possible to control the initializing, writing, and reading operations. Thus, even when a structure of the device is simple, it may be possible to read a multi-valued data.

The number of full-scale driving pulses (i.e., the largest number of pulses; for example, 256) allowing for both of the first and second magnetic memory devices 101*a* and 101*b* to have reversed magnetization, may be predetermined. For the first and second magnetic memory devices 101*a* and 101*b*, the number of the full-scale driving pulses may be given as the same number. An analog value (or multi-valued data) may be written in the first magnetic memory device 101*a* by applying the number of driving pulses corresponding to a write data. The reading operation may include applying a driving pulse (or a current pulse) until the written magnetization of the magnetic memory device are fully reversed. The analog value (or multi-valued data) may be restored (or, output) by subtracting the number of the applied pulses from the number of the full-scale driving pulses. Thus, a write state (or an analog state) may be converted to digital data (e.g., the number of pulses), and it may be possible to realize an analog memory device having a large SN ratio.

According to the present embodiment, it may be possible to realize the magnetic memory device 1000, which can read data of analog values (or multi-valued data), even when it has a simple structure. The magnetic memory device 1000 may not suffer from a difference in characteristics between transistors caused by a variation in a fabrication process, which may occur in an analog complementary metal oxide semiconductor (CMOS). Furthermore, in the magnetic memory device 1000, a complex structure (e.g., a spin current magnetization reversal element) may not be required for a reversal control, and the data erasing, writing, and reading operations may be performed by controlling only driving pulses. In addition, since each magnetic memory device is formed in a perpendicular direction (i.e., in the Z direction), it may be possible to easily increase an integration density of the magnetic memory device 1000 using fabrication technologies for the V-NAND device. Thus, it may be possible to realize a small-sized, large-capacity, nonvolatile memory device.

Figure 18:
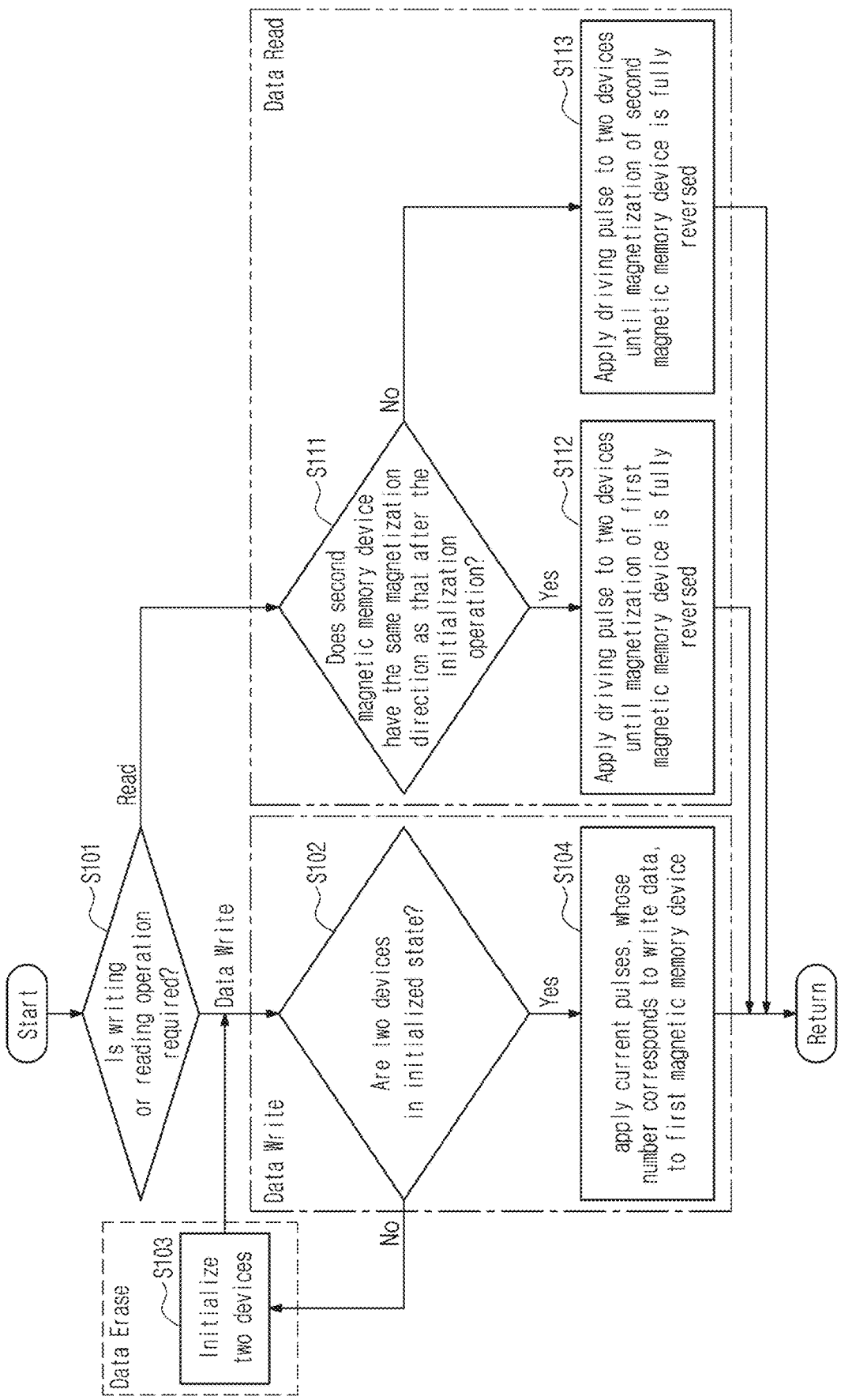
FIG. 18 is a flow chart illustrating a method of operating a magnetic memory device, according to an embodiment of the inventive concept.

Hereinafter, a method of operating the magnetic memory device 1000 will be described in more detail. FIG. 18 is a flow chart illustrating a method of operating the magnetic memory device 1000.

First of all, it may be determined whether a required operation is a writing or reading operation on the magnetic memory device 1000 (in S101). If the data writing operation is required (write in S101), it may be determined whether both of the first and second magnetic memory devices 101*a* and 101*b* are in an initialized state (in S102).

If the first and second magnetic memory devices 101*a* and 101*b* are not in an initialized state (NO in S102), the first and second magnetic memory devices 101*a* and 101*b* may be initialized (in S103). Here, current pulses whose number is 2 times the number of the full-scale pulses may be applied to the first and second magnetic memory devices 101*a* and 101*b*, as shown in FIG. 14. Thus, the first and second magnetic memory devices 101*a* and 101*b* may have magnetization directions that are opposite to each other. The magnetization direction of the free layer 113*a* may become fully upward, and the magnetization direction of the free layer 113*b* may become fully downward.

Meanwhile, the magnetization direction during the initialization operation is not limited to the state illustrated in FIG. 14. For example, the magnetization direction of the free layer 113*a* may be fully downward, and the magnetization direction of the free layer 113*b* may be fully upward. In this case, the write and reading operations may be effectively performed by adjusting the direction of the current pulse. For example, the initialization operation may be performed such that the magnetization direction of the entirety of the free layer 113*a* has the same direction and the magnetization direction of the entirety of the free layer 113*b* has the same direction that is opposite to that of the free layer 113*a*.

If the pair of the first and second magnetic memory devices 101*a* and 101*b* are in an initialized state (YES in S102), current pulses whose number corresponds to a write data may be applied to the first magnetic memory device 101*a* (in S104). As a result, writing of an analog value (or multi-valued data), which is less than the full-scale may be completed. Accordingly, the domain wall in the free layer 113*a* may be moved to a position corresponding to the analog value (or multi-valued data) to be written.

Meanwhile, in the case where data is read out (read in S101), it may be examined whether the second magnetic memory device 101*b* has the same magnetization direction as that after the initialization operation (in S111). If the second magnetic memory device 101*b* has the same magnetization direction as that after the initialization operation (YES in S111), a driving pulse may be applied to the first and second magnetic memory devices 101*a* and 101*b* until the magnetization of the first magnetic memory device 101*a* is fully reversed (in S112). Like the first reading operation shown in FIG. 16, data may be read out from the first magnetic memory device 101*a*, and then, write data may be transferred to the second magnetic memory device 101*b*.

In the case where the second magnetic memory device 101*b* has a different magnetization direction from that after the initialization operation (NO in S111), a driving pulse may be applied to the first and second magnetic memory devices 101*a* and 101*b* until the magnetization of the second magnetic memory device 101*b* is fully reversed (in S113). Data may be read out from the second magnetic memory device 101*b*, and write data may be transferred to the first magnetic memory device 101*a*, like the second reading operation of FIG. 17.

Figure 19:
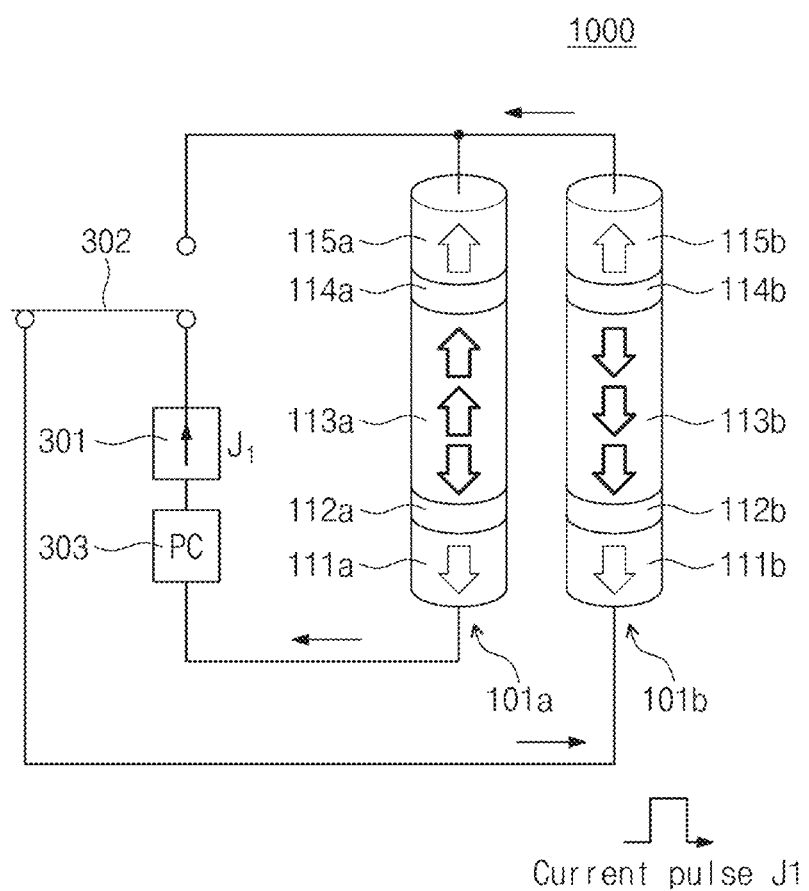
FIG. 19 illustrates a magnetic memory device according to a modified example.

FIG. 19 illustrates a structure according to a modified example. In a first embodiment, a pulse counter 303 may be placed between and connected to the pulse power 301 and the first fixed layer 111*a* of the first magnetic memory device 101*a*. The pulse counter 303 may count the number of current pulses, which are output from the pulse power 301. The data reading operation or the like may be performed, based on the number of the current pulses counted by the pulse counter 303. Accordingly, even when a structure of the device is simple, it may be possible to write and read a multi-valued data.

Since each the magnetic memory device 1000 is used as a memory device (e.g., an accumulator) of a coupling weight value or a critical value of an analog neuron, it may be used to construct a neural network or a reservoir computing model. Commercialization of a highly-integrated analog memory may contribute to research such as artificial intelligence (AI) calculation. Accordingly, calculation for the neural network or the reservoir calculation model may be conducted in a simple and fast manner.

Embodiment 1

Figure 20:
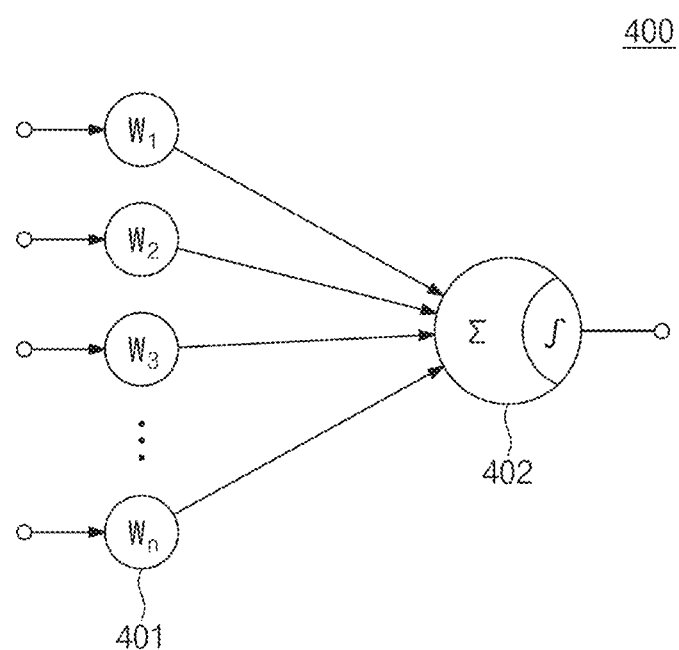
FIG. 20 illustrates a model, in which a magnetic memory device is applied to a neuron.

A structure of an embodiment 1 will be described in more detail with reference to FIG. 20. In the embodiment 1, an example, in which the magnetic memory device 1000 is applied to a neural network 400 of an artificial intelligence (AI) model, is schematically illustrated. In detail, the magnetic memory device 1000 may retain a coupling weight value of a coupling weight (or a coupling node) 401 of a neuron structure. The pulse counter 303 shown in FIG. 19 may be used to control writing and reading operations.

An accumulator 402 may calculate a total sum, which is obtained by multiplying an output of a previous layer by weights of coupling weights (or coupling nodes) 401. The magnetic memory device 1000 may also be applied to the accumulator 402. For example, the magnetic memory device 1000 may be used to write the multiplication value calculated by the accumulator 402. In addition, the magnetic memory device 1000 may be used to retain or preserve a critical value, which will be compared with the total sum obtained by the accumulator 402.

In the case of the conventional neural network, binary digital spike pulses, which are given as two different voltage levels (e.g., low or high), may be used for communication between neurons. By contrast, in the present embodiment, by integrating and using a plurality of the magnetic memory devices 1000, it may be possible to realize the communication between neurons using continuous analog values (or multiple values). This may make it possible to construct an analog spiking neural network integrated circuit. Since the magnetic memory devices 1000 are used as analog neurons, they may be used for application to a multi-layered neural network. In this case, the calculation of the neural network may be executed in a simple and fast manner.

For example, in the case where a coupling weight value or a critical value is represented by 256 gradations, for a digital memory, a device having a size of 8 bits may be required, but in the case where the magnetic memory device 1000 according to the present embodiment is used, only a pair of magnetic memory devices 101 may be used to store the required values. In addition, for the accumulator 402, a value, which is obtained by pulse-counting a value from each device as an analog value (or multi-valued data) as it is, may be stored in the magnetic memory device 1000.

As for the coupling weight value, coupling weight values W1 to Wn may be obtained by a learning process, which is performed to minimize an error between an ideal output value of a training pattern, whose initial values are previously prepared as random data, and an output value of a neural network, using an algorithm such as backpropagation. In this case, the magnetic memory device 1000 according to the present embodiment may be used to retain an optimized coupling weight value. A training-purposed circuit may be realized with a circuit formed by integrating the magnetic memory device 1000 or using another training-purposed circuit. The algorithm such as backpropagation, may be used as it is.

In addition, in the case where a value, which is greater than a full-scale of a single magnetic memory device 101, should be written, two or more magnetic memory devices 101, which are connected in series, may be used for such a purpose. This structure will be described with reference to FIG. 21.

Figure 21:
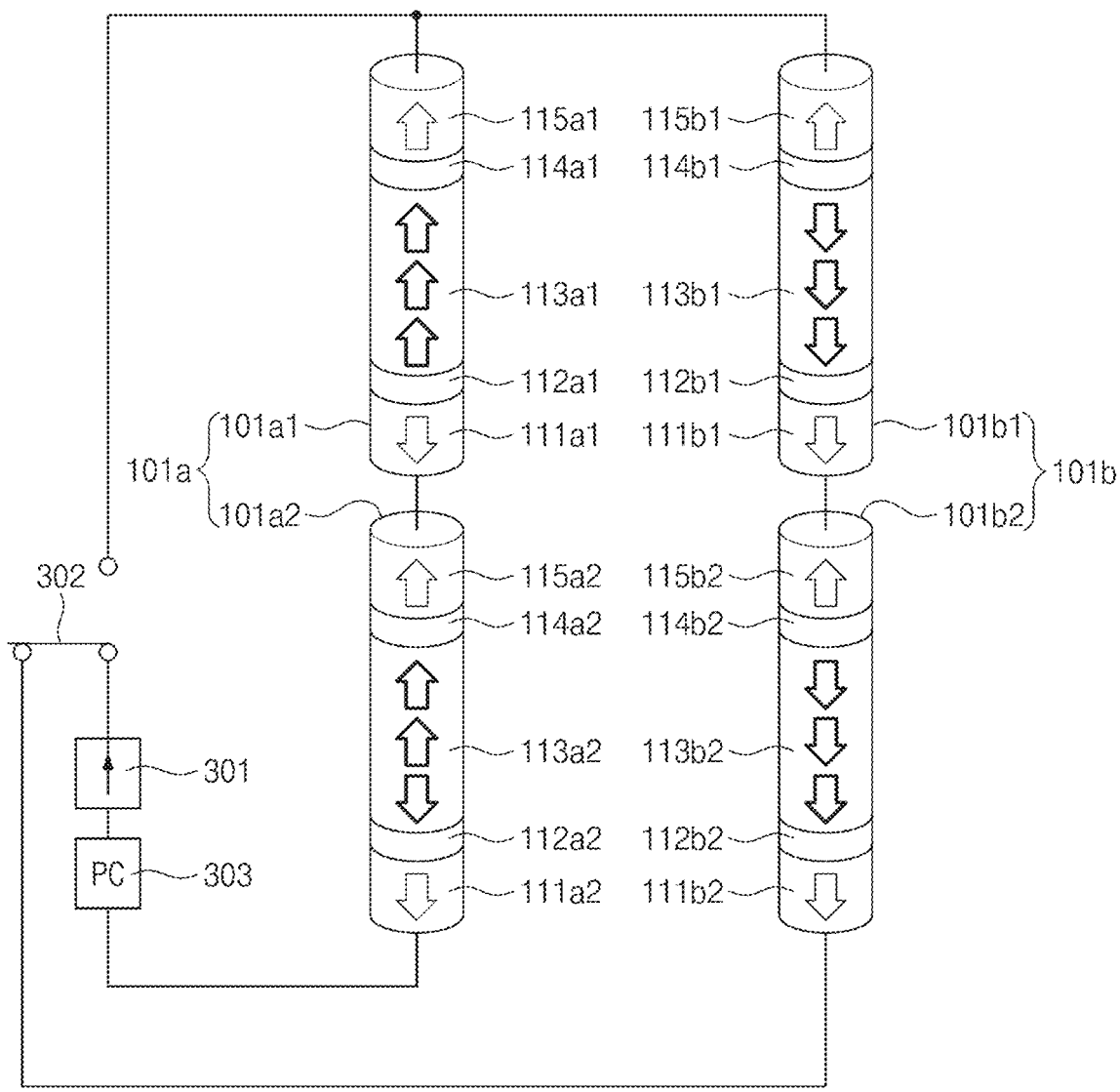
FIG. 21 illustrates a structure, in which two magnetic memory devices are connected in series to each other.

Referring to FIG. 21, two magnetic memory devices 101a1 and 101a2 may be connected to constitute the first magnetic memory device 101a. A first fixed layer 111a1 of the magnetic memory device 101a1 may be connected to a second fixed layer 115a2 of the magnetic memory device 101a2. Similarly, magnetic memory devices 101b1 and 101b2 may be connected to constitute the second magnetic memory device 101b. A first fixed layer 111b1 of the magnetic memory device 101b1 may be connected to a second fixed layer 115b2 of the magnetic memory device 101b2.

In this case, it may be possible to increase a write capacity of the magnetic memory device 1000. For example, in the case where the full-scale of the magnetic memory devices 101a1 and 101a2 are 256, the full-scale of the first magnetic memory device 101a may be 512. Likewise, the first magnetic memory device 101a may be composed of a plurality of magnetic memory devices and may write data In FIG. 21, each of the first and second magnetic memory devices 101a and 101b is illustrated to have two memory devices connected in series, and three or more memory devices may be connected in series.

Since a plurality of magnetic memory devices having the same structure are connected in series, it may be possible to increase a writable value. Since the magnetic memory device 1000 is realized by merely connecting the magnetic memory devices of the same structure, the magnetic memory device 1000 may have a simple shape. In addition, by virtue of the same device structure, it may be possible to reduce a process variation in a fabrication process. In the case where the gradation of the accumulator 402 is greater than the full-scale of the first and second magnetic memory devices 101a and 101b, two or more magnetic memory devices 101 may be connected in series.

Embodiment 2

Figure 22:
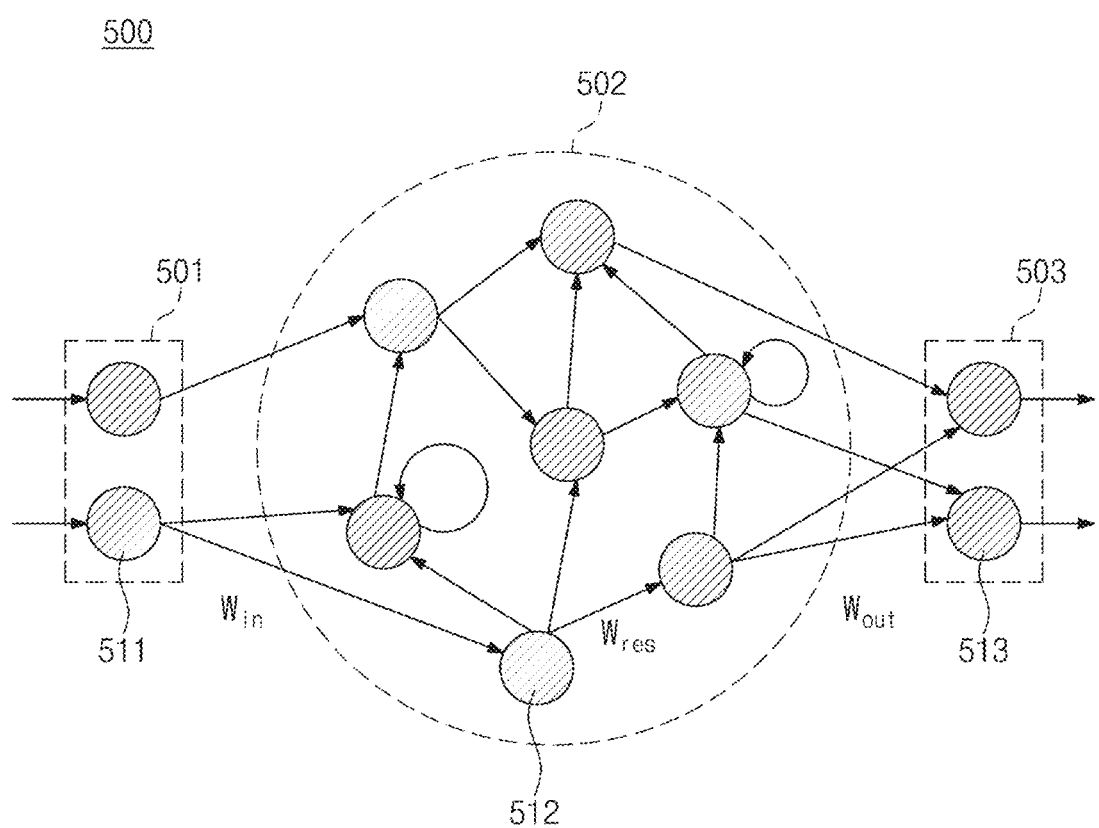
FIG. 22 illustrates a reservoir calculation model, in which a magnetic memory device is applied to a neuron.

The magnetic memory device 1000 may be applicable to a reservoir calculation model. FIG. 22 illustrates an example in which the magnetic memory device 1000 is used for a reservoir calculation model 500. At least one or all of a node 511 of an input layer 501, a node 512 in a reservoir 502, a node 513 of an output layer 503 may be realized with the magnetic memory device 1000.

The magnetic memory device 1000 may retain a weight of the reservoir calculation model 500. As for the weight calculation, the algorithm, such as backpropagation, depicted by the neuron structure of the embodiment 1, may be used as it is. Weights $W_{in}$, $W_{res}$, and $W_{out}$ may be obtained by using the algorithm, such as backpropagation, to reduce an error between an (ideal) output value of a previously-prepared training pattern and an output value of the reservoir calculation model. Then, each value may be stored in the magnetic memory device 1000. By doing this, computation of the reservoir calculation model may be executed in a simple and fast manner.

By using an analog spiking neural network integrated circuit as the reservoir, a high-speed, high-density, and high-accuracy calculation using an analog value (or multi-valued data) may be possible, compared with a reservoir calculation using a spin transfer torque magnetic random access memory (STT-MRAM) or a spin-torque oscillator (STO). The magnetic memory device 1000 may be used as an AD converter or a DA converter.

According to an embodiment of the inventive concept, provided are a magnetic memory device, which has a simple structure and can read an analog value (or multi-valued data), and a method of operating the same.

While example embodiments of the inventive concept have been particularly shown and described, it will be understood by one of ordinary skill in the art that variations in form and detail may be made therein without departing from the spirit and scope of the attached claims.

What is claimed is:

1. A magnetic memory device, comprising:
    a first magnetic memory device;
    a second magnetic memory device connected to the first magnetic memory device;
    a pulse power supplying current pulses to the first and second magnetic memory devices; and
    a switch configured to selectively connect the pulse power to one of the first and second magnetic memory devices,
    wherein each of the first and second magnetic memory devices comprises a first fixed layer, a first non-magnetic layer, a free layer, a second non-magnetic layer, and a second fixed layer, which are sequentially stacked, the first fixed layer having a magnetization direction maintained in a fixed direction, the free layer having a perpendicular magnetic anisotropy and a variable magnetization direction, the second fixed layer having a magnetization direction maintained in an opposite direction of the first fixed layer, and
    a resistance value of an MTJ device composed of the first fixed layer, the first non-magnetic layer, and the free layer is different from a resistance value of an MTJ device composed of the second fixed layer, the second non-magnetic layer, and the free layer.

2. The magnetic memory device of claim 1, further comprising a pulse counter which is used to count the number of the current pulses supplied from the pulse power.

3. The magnetic memory device of claim 2, wherein each of the first and second magnetic memory devices comprises two or more memory devices connected in series.

4. The magnetic memory device of claim 2, wherein the second fixed layer of the first magnetic memory device is connected to the second fixed layer of the second magnetic memory device,
    one of two outputs of the pulse power is connected to the first fixed layer of the first magnetic memory device, and
    the switch is configured to change connection of the pulse power such that the other of the two outputs of the pulse power is connected to the second fixed layer of the first magnetic memory device or the first fixed layer of the second magnetic memory device.

5. The magnetic memory device of claim 4, wherein each of the first and second magnetic memory devices comprises two or more memory devices connected in series.

6. The magnetic memory device of claim 4, wherein, when a data reading operation on the magnetic memory device is performed, the other of the two outputs of the pulse power is switched to be connected to the first fixed layer of the second magnetic memory device by the switch,
    the data reading operation comprises a first reading operation and a second reading operation which are alternately performed, and
    the pulse power produces current pulses flowing in opposite directions, in the first and second reading operations.

7. The magnetic memory device of claim 6, wherein each of the first and second magnetic memory devices comprises two or more memory devices connected in series.

8. The magnetic memory device of claim 6, wherein the other of the two outputs of the pulse power is switched to be connected to the first fixed layer of the second magnetic memory device by the switch, when a data erase operation on the magnetic memory device is performed, and
    the other of the two outputs of the pulse power is switched to be connected to the second fixed layer of the first magnetic memory device by the switch, when a data write operation on the magnetic memory device is performed.

9. The magnetic memory device of claim 8, wherein each of the first and second magnetic memory devices comprises two or more memory devices connected in series.

10. The magnetic memory device of claim 1, wherein each of the first and second magnetic memory devices comprises two or more memory devices connected in series.

11. The magnetic memory device of claim 1, wherein the magnetic memory device is used to write a coupling weight value of a neural network.

12. The magnetic memory device of claim 1, wherein the magnetic memory device is used to write a weight of a reservoir calculation model.

13. The magnetic memory device of claim 1, wherein the second fixed layer of the first magnetic memory device is connected to the second fixed layer of the second magnetic memory device,
    one of two outputs of the pulse power is connected to the first fixed layer of the first magnetic memory device, and
    the switch is configured to change connection of the pulse power such that the other of the two outputs of the pulse power is connected to the second fixed layer of the first magnetic memory device or the first fixed layer of the second magnetic memory device.

14. The magnetic memory device of claim 13, wherein, when a data reading operation on the magnetic memory device is performed, the other of the two outputs of the pulse power is switched to be connected to the first fixed layer of the second magnetic memory device by the switch,
    the data reading operation comprises a first reading operation and a second reading operation which are alternately performed, and
    the pulse power produces current pulses flowing in opposite directions, in the first and second reading operations.

15. The magnetic memory device of claim 14, wherein the other of the two outputs of the pulse power is switched to be connected to the first fixed layer of the second magnetic memory device by the switch, when a data erase operation on the magnetic memory device is performed, and
    the other of the two outputs of the pulse power is switched to be connected to the second fixed layer of the first magnetic memory device by the switch, when a data write operation on the magnetic memory device is performed.

16. A method of operating a magnetic memory device, wherein the magnetic memory device comprises a first magnetic memory device and a second magnetic memory device connected to the first magnetic memory device, each of the first and second magnetic memory devices comprises a first fixed layer, a first non-magnetic layer, a free layer, a second non-magnetic layer, and a second fixed layer, which are sequentially stacked, the first fixed layer having a magnetization direction maintained in a fixed direction, the free layer having a perpendicular magnetic anisotropy and a variable magnetization direction, the second fixed layer having a magnetization direction maintained in an opposite direction of the first fixed layer, and a resistance value of an MTJ device composed of the first fixed layer, the first non-magnetic layer, and the free layer is different from a resistance value of an MTJ device composed of the second fixed layer, the second non-magnetic layer, and the free layer, wherein the method of operating the magnetic memory device comprises:

a first reading step supplying driving pulses to the first and second magnetic memory devices until the entirety of the free layer of the first magnetic memory device has the same magnetization direction, thereby transferring a data value, which is written in the free layer of the first magnetic memory device, to the free layer of the second magnetic memory device; and a second reading step supplying driving pulses to the first and second magnetic memory devices until the entirety of the free layer of the second magnetic memory device has the same magnetization direction, thereby transferring a data value, which is written in the free layer of the second magnetic memory device, to the free layer of the first magnetic memory device.

17. The method of claim 16, before the first reading step and the second reading step, further comprising, an erase step supplying driving pulses to the first and second magnetic memory devices such that the entirety of the free layer of the first magnetic memory device has the same magnetization direction and the entirety of the free layer of the second magnetic memory device has the same magnetization direction; and a write step supplying current pulses whose number is given based on a data value to be written to the first magnetic memory device to change the magnetization direction of the free layer of the first magnetic memory device.

18. The method of claim 17, wherein the first reading step and the second reading step are performed in an alternate manner.

19. The method of claim 16, wherein the first reading step and the second reading step are performed in an alternate manner.

* * * * *